US009298858B1

(12) United States Patent
Tomar

(10) Patent No.: US 9,298,858 B1
(45) Date of Patent: Mar. 29, 2016

(54) SYSTEM AND METHOD FOR REDUCING MODELS BASED ON A CRITERION

(71) Applicant: The MathWorks, Inc., Natick, MA (US)

(72) Inventor: Agnivesh Tomar, Waltham, MA (US)

(73) Assignee: THE MATHWORKS, INC., Natick, MA (US)

( * ) Notice: Subject to any disclaimer, the term of this patent is extended or adjusted under 35 U.S.C. 154(b) by 502 days.

(21) Appl. No.: 13/650,445

(22) Filed: Oct. 12, 2012

(51) Int. Cl.
G06F 11/36 (2006.01)
G06F 17/50 (2006.01)
G06N 5/00 (2006.01)

(52) U.S. Cl.
CPC ........ *G06F 17/5009* (2013.01); *G06F 11/3608* (2013.01); *G06N 5/00* (2013.01)

(58) Field of Classification Search
None
See application file for complete search history.

(56) References Cited

U.S. PATENT DOCUMENTS

| | | | | |
|---|---|---|---|---|
| 6,092,038 | A * | 7/2000 | Kanevsky et al. | 704/9 |
| 6,708,143 | B1 * | 3/2004 | Kurshan | 703/2 |
| 7,324,931 | B1 | 1/2008 | Warlock | |
| 7,509,244 | B1 * | 3/2009 | Shakeri et al. | 703/7 |
| 7,558,712 | B1 | 7/2009 | Aldrich | |
| 7,742,903 | B2 | 6/2010 | Ciolfi et al. | |
| 7,991,598 | B1 | 8/2011 | Wood | |
| 8,359,183 | B1 | 1/2013 | Aldrich | |
| 2009/0326886 | A1 * | 12/2009 | Arbel et al. | 703/6 |

OTHER PUBLICATIONS

Hauser et al., Hierarchical model-order reduction for robust design of parameter-varying systems, 2012 International Conference on Synthesis, Analysis, Modeling and SMACD, Sep. 2012.*
Sheffer, Model simplification for meshing using face clustering, Computer-Aided Design 33:925-934, 2001.*
Salzig et al., Design of robust electronic circuits for yield optimization; 2010 XIth International Workshop on Symbolic and Numerical Methods, Oct. 4-6, 2010, pp. 1-5.*
Hauser, Matthias, et al., "Fast and Robust Symbolic Model Order Reduction with Analog Insydes," V. P. Gerdt et al. (Eds.): CASC 2011, LNCS 6885, Springer-Verlag Berlin Heidelberg, 2011, pp. 215-225.
"Simulink User's Guide: R2012a," The MathWorks, Inc., Mar. 2012, pp. 1-2326.

* cited by examiner

*Primary Examiner* — Kakali Chaki
*Assistant Examiner* — Michael Zidanic
(74) *Attorney, Agent, or Firm* — Cesari and McKenna LLP; Michael R. Reinemann

(57) ABSTRACT

A system generates a simplified model from an original model, where the simplified model exhibits the same error or undesired behavior as the original model but is smaller. A condition may be defined that, when evaluated, may determine whether the error or undesired behavior occurs in a model. A search engine may identify one or more portions of the original model as candidates for deletion. A series of intermediate models of decreasing size may be constructed by deleting selected ones of the candidate portions, provided that the intermediate models also produce the same error or undesired behavior. The system may continue an iterative process until it resolves to the simplified model, and the simplified model may be analyzed to locate the source or cause of the error or undesired behavior.

24 Claims, 19 Drawing Sheets

SYSTEM AND METHOD FOR REDUCING MODELS BASED ON A CRITERION

BRIEF DESCRIPTION OF THE DRAWINGS

The invention description below refers to the accompanying drawings, of which.

DETAILED DESCRIPTION OF ILLUSTRATIVE EMBODIMENTS

Background

Figure 1:
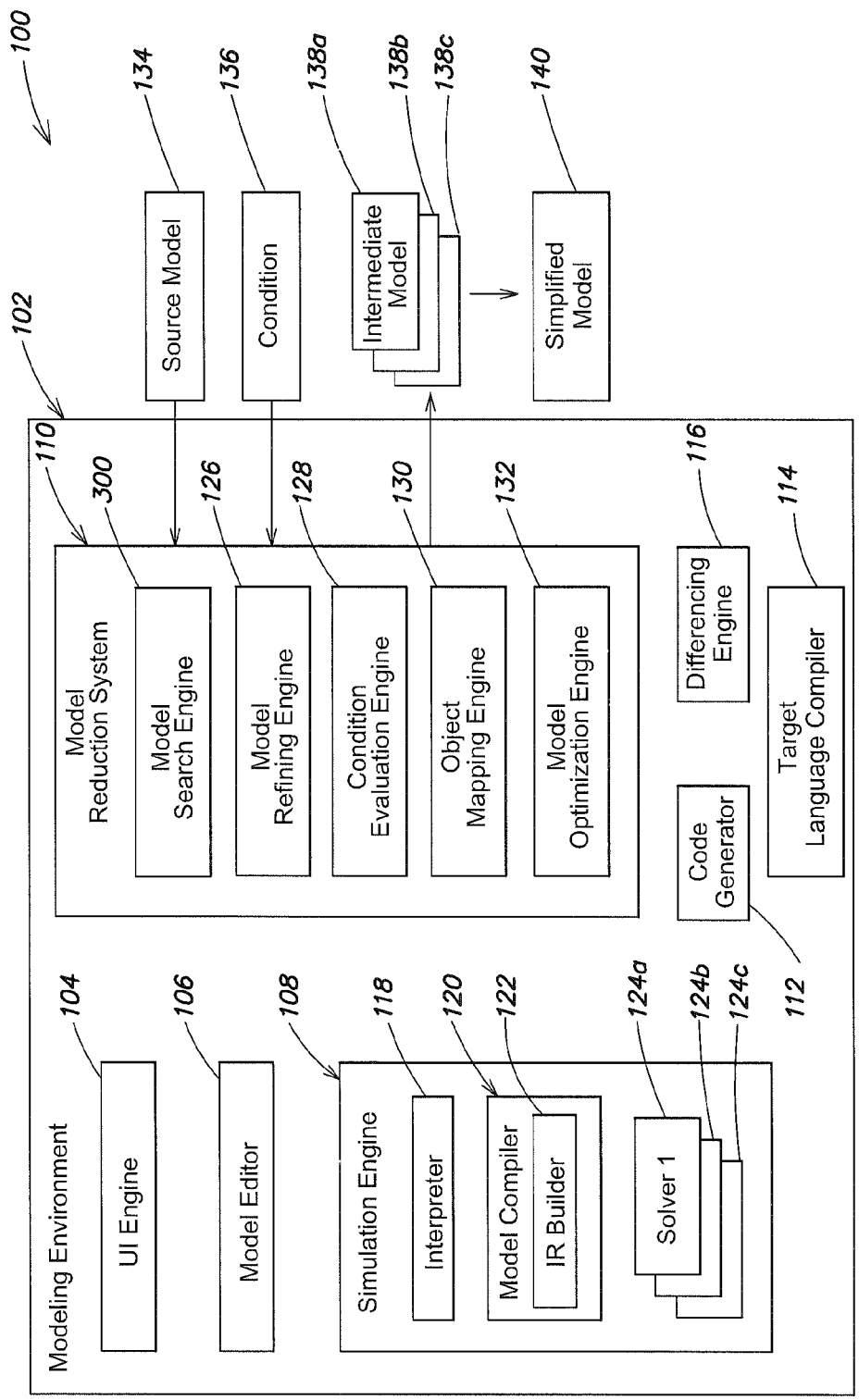
FIG. 1 is a functional block diagram of a system for automatically reducing the size of models according to an embodiment of the invention.

To evaluate a system, such as a physical system, an engineer or designer may use a modeling tool to construct a computer-generated model of the system. The computer generated model may have executable semantics, and the model may be constructed such that, when the model is executed, it simulates the operation of the physical system. The modeling tool may include a simulation or execution engine for executing the model. Execution of the model may produce results that may be evaluated, for example to see whether the model accurately simulates the operation of the physical system, or whether the model behaves as the designer intended. The physical system being modeled may be a controller. When the designer is satisfied with the behavior of the model, the designer may generate code, such as source code, for the model. The generated source code may be compiled, and the compiled code may be loaded onto target hardware. The target hardware, which implements the designed controller, may be embedded in a system.

For a complex system, the model can be extremely large. For example, a graphically specified model, such as a block diagram model, may have hundreds, thousands or even tens of thousands of individual blocks each performing some function or operation, such as a mathematical operation, a Boolean operation, a filter operation, etc.

Errors or other undesired behaviors may occur in connection with a model. For example, errors may occur during the execution or compilation of the model. The designer may remove some of the model's blocks to create a smaller version of the model, and see whether the error or undesired behavior still occurs in this smaller version. If so, the designer may study the smaller version to try and locate the source of the error or undesired behavior. This process, however, is difficult and time-consuming.

Overview

Briefly, the invention relates to a system and method for generating a simplified model from an original model automatically, where the simplified model exhibits the same error or undesired behavior as the original model but is smaller in size than the original model. The system may include a model search engine, a model refining engine, a condition evaluation engine, an object mapping engine, and a model optimizing engine. The system may perform an iterative process in which a series of intermediate models of decreasing size are constructed that still produce the same error or undesired behavior as the original model.

The system may continue the iterative process until it resolves to a simplified model that may be or may approach the smallest size model that still exhibits the error or undesired behavior. A user, such as a designer or an automated process, may analyze the simplified model to locate the source of the error or undesired behavior. The user may correct the original model so that it no longer exhibits the error or undesired behavior. By starting the analysis on the simplified model, the process of locating the source of the error or behavior can be performed more quickly.

In operation, the system may receive a source model and a criterion or condition. The condition may be user specified. That is, the condition may be a function written by the user that evaluates to either a first or a second value, such as True or False. Evaluation of the condition may indicate whether the error or undesired behavior occurred, e.g., condition evaluates to True, or not, e.g., the condition evaluates to False.

The model search engine may identify a portion of the source model that is a candidate for deletion, and the model refining engine may delete the identified model portion, thereby generating an intermediate model. The condition evaluation engine may evaluate the specified condition against the intermediate model to see whether the intermediate model also produces the error or undesired behavior. If so, the model search engine may identify a portion of the intermediate model for deletion, and the portion may be deleted by the model refining engine. The condition evaluation engine may again evaluate the specified condition. This process may continue until an intermediate model is produced for which no additional portion can be deleted and still cause the condition to be satisfied. This final intermediate model may be designated the simplified model, and may be output, e.g., for review by the user. If the source model includes hierarchical levels, the model search engine may evaluate one or more of these hierarchical levels, and may reduce the size of the source model at the one or more hierarchical levels.

To the extent changes are made to the graphical objects of one or more of the intermediate models, such as changes to the names, locations or other aspects of the graphical objects, the object mapping engine may map the graphical objects of the one or more intermediate models to the corresponding graphical objects of the source model. The object mapping engine also may generate an object mapping report that includes the mapping.

The user may analyze the object mapping report and the simplified model manually or programmatically, for example by running one or more analysis tools, to locate the source of the error or undesired behavior.

The model search engine may apply one or more search algorithms to select the model portion to be deleted at each iteration. In an embodiment, the model search engine may apply a binary search algorithm followed by a linear search algorithm. In particular, the model search engine may include a binary search engine and a linear search engine. The binary search engine may include a block set generator, and the linear search engine may include a block dependency list generator. The block set generator of the binary search engine may evaluate the source model, and generate one or more sets of blocks. Each set may be divided into two bundles where each bundle contains half of the blocks of the respective set. A reverse execution or dependency order list of blocks within each set and within each bundle may be created by the binary search engine.

Starting with a first set, the binary search engine may construct a first binary intermediate model that corresponds to the source model except that the blocks of a first bundle of the first set are deleted. The first binary intermediate model may be executed, and the condition evaluation engine may determine whether or not the specified condition is satisfied. If the specified condition is satisfied, meaning the first binary intermediate model also exhibits the error or undesired behavior, the binary search engine may construct a second binary intermediate model. The second binary intermediate model may correspond to the first binary intermediate model except that another bundle of blocks are deleted, such as the blocks of a first bundle of a second set, or even the second bundle of the first set where the model includes multiple sets of blocks. The second binary intermediate model may be executed, and the condition evaluated. If the condition is not satisfied, the system may discard the second binary intermediate model, and revert back to the first binary intermediate model. This process may be repeated for each set of blocks identified by the block set generator, resolving in a final binary intermediate model for which the condition is satisfied.

The linear search engine may analyze the final binary intermediate model in an effort to reduce its size further. For example, the block dependency list generator may analyze the final binary intermediate model, and generate a dependency order list of the blocks of the final binary intermediate model. In an embodiment, the dependency order list for each group may represent an execution or dependency order of the blocks within the respective group. Starting with a first group of blocks, the linear search engine may generate a first linear intermediate model that corresponds to the final binary intermediate model except that the last block in the dependency order list from the first group is deleted.

The condition may then be evaluated using the first linear intermediate model. If the condition is satisfied, the linear search engine may construct a second linear intermediate model, and may generate a new dependency order list. The second intermediate linear model may correspond to the first linear intermediate model except that the last block in the new dependency order may be deleted. The condition may be evaluated using the second linear intermediate model. If the condition evaluates to False, the system may discard the second linear intermediate model, and revert back to the first linear intermediate model. This process may be repeated for each group of blocks identified by the block dependency list generator, resolving in a final linear intermediate model.

The final linear intermediate model may be designated as the simplified model, and may represent the smallest or approaching the smallest size model as compared to the source model that also exhibits the error or undesired behavior. The system may return or output the simplified model.

The system may receive one or more options from the user. The one or more options may guide or control the process of reducing the source model to the simplified model. For example, a first option may designate one or more portions of the source model, such as a subsystem, a reference model, or a hierarchical level, as being off limits. In response, the system may not process, and may leave the designated model portion within the simplified model. A second option may designate the depth of the hierarchy to be analyzed. A third option may designate one or more model portions that are to be analyzed to the exclusion of other model portions.

In an embodiment, the model optimization engine may apply one or more optimizations to the source model or to one or more of the intermediate models to facilitate the model reduction process. For example, the model optimization engine may identify and replace, modify or eliminate particular types of blocks.

FIG. 1 is a functional block diagram of a system 100 for automatically reducing the size of graphical models according to an embodiment of the invention. The system 100 may include a modeling environment 102 having a plurality of components. In particular, the modeling environment 102 may include a user interface (UI) engine 104, a model editor 106, a simulation engine 108, a model reduction system 110, a code generator 112, a target language compiler 114, and a differencing engine 116.

The UI engine 104 may be configured to create a user interface, such as a Graphical User Interface (GUI), through which a user may work with and control the modeling environment 102. The model editor 106 may be configured to perform operations on models, such as open, create, edit, and save operations, in response to user inputs through the GUI. The simulation engine 108 may be configured to execute, e.g., compile and run or interpret, models created or opened by the user.

The code generator 112 may be configured to generate computer programming code, such as source and/or object code, from a model. The target language compiler 114 may be configured to compile source code, such as source code generated by the code generator 112, into an executable form, such as one or more object code files or binaries, for execution by a particular processor, such as a central processing unit (CPU), an embedded processor, a microcontroller, etc. The differencing engine 116 may be configured to analyze two models, identify the differences between them, and generate a report on the identified differences. Suitable code generators for use with the present invention include, but are not limited to, the Simulink Coder, the Embedded Coder, and the Simulink HDL Coder products from The MathWorks, Inc. of Natick, Mass., and the TargetLink product from dSpace GmbH of Paderborn Germany. Suitable target language compilers include the xPC Target™ tool from The MathWorks, Inc., and a C language compiler. However, other code generation systems and other compilers may be used.

The simulation engine 108 may include an interpreter 118, a model compiler 120 that, in turn, may include one or more Intermediate Representation (IR) builders, such as IR builder 122, and one or more, and preferably a plurality, of solvers, such as solvers 124a-c. Exemplary solvers include one or more fixed-step continuous solvers, which may utilize integration techniques based on Euler's Method or Heun's Method, and one or more variable-step solvers, which may be based on the Runge-Kutta and Dormand-Prince pair. A non-exhaustive description of suitable solvers may be found in the *Simulink 7 User's Guide* from The MathWorks, Inc. (March 2012 ed.), which is hereby incorporated by reference in its entirety.

Models constructed by the modeling environment 102 may include textual models, graphical models, and combinations of graphical and textual models.

In an embodiment, the modeling environment 102 is a high-level modeling environment. Suitable high-level modeling environments include the MATLAB® and Simulink® technical computing environments from The MathWorks, Inc., as well as the Simscape physical modeling system and the Stateflow charting tool also from The MathWorks, Inc., the MapleSim physical modeling and simulation tool from Waterloo Maple Inc. of Waterloo, Ontario, Canada, the LabVIEW programming system and the NI MatrixX model-based design product both from National Instruments Corp. of Austin, Tex., the Visual Engineering Environment (VEE) from Agilent Technologies, Inc. of Santa Clara, Calif., the System Studio model-based signal processing algorithm design and analysis tool from Synopsys, Inc. of Mountain View, Calif., the SPW signal processing algorithm tool from Synopsis, a Unified Modeling Language (UML) system, a Systems Modeling Language (SysML) system, the System Generator system from Xilinx, Inc. of San Jose, Calif., and the graphical modeling systems described in U.S. Pat. No. 7,324,931 for Conversion of Model Components Into References and U.S. Pat. No. 7,991,598 for Method and System for Modeling a Mechanical System, which are hereby incorporated by reference in their entireties, among others. Models created in the high-level modeling environment may contain less implementation detail, and thus operate at a higher level than certain programming languages, such as the C, C++, C#, and SystemC programming languages.

Those skilled in the art will understand that the MATLAB® technical computing environment is a math-oriented, textual programming environment for digital signal processing (DSP) design, among other uses. The Simulink® technical computing environment is a model-based design environment for modeling and simulating dynamic systems, among other uses. The MATLAB® and Simulink® tools provide a number of high-level features that facilitate algorithm development and exploration, and support model-based design. Exemplary high-level features include dynamic typing, array-based operations, data type inferencing, sample time inferencing, and execution order inferencing, among others.

In another embodiment, a lower level programming language, such as the C, C++, and C# programming languages, among others, may be used to create one or more models.

The models may approximate operation of a system. Exemplary systems include physical systems, such as weather systems, financial markets, plants, controllers, etc.

The model reduction system 110 may include a model search engine 300, a model refining engine 126, a condition evaluation engine 128, an object mapping engine 130, and a model optimization engine 132. In other embodiments, the model reduction system 110, or one or more components thereof, may be separate from the modeling environment 102. In that case, the model reduction system 110 may be in communication with the modeling environment 102, e.g., through local or remote procedure calls, or an Application Programming Interface (API). As described herein, the model reduction system 110 may receive a source model 134 for analysis, and a condition 136 for the source model 134. The source model 134 may be identified to the model reduction system 110 and the condition 136 may be defined by a user of the modeling environment, e.g., through the GUI created by the UI engine 102, and passed to the model reduction system 110. The model reduction system 110 may create one or more intermediate models, such as intermediate models 138$a$-$c$, from the source model 134, as the model reduction system 110 works to reduce the source model 134 to (or at least approaching) a minimum size that still satisfies the condition 136. The model reduction system 110 may thus construct automatically, from the source model 134, a simplified model 140 that may represent a minimized (or near minimized) version of the source model 134 that still satisfies the condition 136.

In an embodiment, the model reduction system 110 as well as other components of the modeling environment 102 may be implemented through one or more software modules or libraries containing program instructions pertaining to the methods described herein. The software modules may be stored in memory, such as a main memory unit and/or on computer readable media, of a workstation or other data processing machine, and executed by one or more processing elements. Other computer readable media may also be used to store and execute these program instructions, such as non-transitory computer readable media for example optical, magnetic, or magneto-optical media. In another embodiment, the model reduction system 110 or portions thereof may comprise registers and combinational logic configured and arranged to produce sequential logic circuits. In alternative embodiments, various combinations of software and hardware, including firmware, may be utilized to implement the present invention.

FIGS. 2A-D are a flow diagram of a method in accordance with an embodiment of the invention. The model reduction system 110 may receive an identification of a model, such as the source model 134, to be reduced, as indicated at block 202. To the extent the model is a graphical model, it may include a plurality of graphical objects, such as icons or blocks, and relationships, such as connections, may be defined or established among the blocks. The relationship may or may not be visually specified. The blocks of the model may represent, for example, dynamic systems, computations, functions, operations, states, and physical components, and the connections, which may appear visually as wires or arrows, among the objects may represent, for example, data, control, signals, events, transitions, mathematical relationships, or physical connections. A set of interconnected blocks may be organized into a subsystem, and a set of graphical state objects may be organized into a subchart. A model may include one or more blocks, subsystems, and/or subcharts. In addition, a sub-model may be included in a parent model, for example through a model reference block appearing in the parent model.

The model reduction system 110 also may receive a condition or criterion for the source model, as indicated at block 204. In an embodiment, the condition may be a function defined by the user, and may produce either a first or a second value when evaluated. In addition, evaluation of the condition includes execution of a model. In an embodiment, a user may write a condition function using a programming language. The condition function may check whether some action occurs, such as a crash when the identified model is executed, the generation of a particular simulation error, the generation of a particular error during code generation, the generation of a particular error by a block of the model, the existence of an output mismatch between a controller portion of a model and a plant portion of a model, etc. Because the condition function is user-specified, it can be tailored by the user to the particular error or model behavior of interest to the user.

In an embodiment, the model reduction system 110 may include one or more predefined condition functions that may be selected by the user. A first predefined condition function may be created to compare one or more outputs generated during the simulation of a model with one or more respective outputs generated during execution of code generated from the model, and to detect whether there is a mismatch between the compared outputs. The first predefined function may include functions or commands for simulating, e.g., executing, the model, generating code from the model, executing the generated code, and comparing output values produced during model simulation with respective output values produced during execution of the generated code. If a mismatch in output values is detected, the first condition function may set a variable to a first value, e.g., True, otherwise, the variable may be set to a second value, e.g., False. A second predefined condition may be created to detect the occurrence of one or more errors during the code generation process for a model. The second predefined condition may include functions or commands for generating code from a model, and for detecting whether one or more errors are generated during the code generation process. If an error is detected, the second predefined condition may set a variable to True, and if no error is detected, the variable may be set to False. A third predefined condition function may be created to determine whether a programming environment crashes when one or more selected operations are run on a model. The third predefined condition may include functions or commands for running the selected operations on the model, and for detecting whether the program environment crashes. For example, the third predefined condition may run operations on a Simulink model, and determine whether the MATLAB environment crashes. It should be understood that other and/or additional predefined conditions may be created and stored by the model reduction system 110 for selection by a user.

The model reduction system 110 may receive one or more options that control the process of reducing the source model 134, as indicated at block 206. For example, a first option may indicate whether or not sub-models (e.g., referenced models) of the source model 134 are to be reduced. A second option may indicate whether subsystems of the source model 134 are to be reduced. A third option may specify the depth of the model's hierarchy to be searched. For example, a user may specify that the model is to be searched to a hierarchical depth of three, four, etc. A fourth option may indicate whether linked library blocks are to be reduced. A fifth option may indicate that a copy of the source model 134 should not to be made. A sixth option may specify one or more user selected names to be assigned to the intermediate models to avoid possible conflicts with other model names. A seventh option may specify one or more blocks of the source model 134 to be excluded from the model reduction process. Those skilled in the art will understand that other options may be provided. Default valves may be assigned to one or more of the options.

The model reduction system 110 may create a copy of the source model 134, and may operate on this copy of the source model 134, rather than on the original source model 134 itself, as indicated at block 208. The model reduction system 110 may designate the copy of the source model 134 as the current intermediate model, e.g., intermediate model 138a, as indicated at block 210.

To the extent the current intermediate model 138a includes locked objects, the model reduction system 110 may unlock such locked objects, as indicated at block 212. For example, the current intermediate model 138a may include one or more linked library blocks. A linked library block refers to a block that encapsulates, in a hierarchical manner, one or more other blocks. The linked library block, however, which may be stored in a library, may be locked against editing. The linked library block is unlocked so that it may be edited by the model reduction system 110. For example, the model reduction system 110 may delete one or more of the blocks that make up the linked library object, as part of the automated model reduction process.

The model refining engine 126 may remove any dangling connections in the source model 134, as indicated at block 214. A dangling connection may refer to an arrow or line whose head or tail is unconnected, e.g., the arrow's head is not connected to a sink block or its tail is not connected to a source block.

Figure 2A:
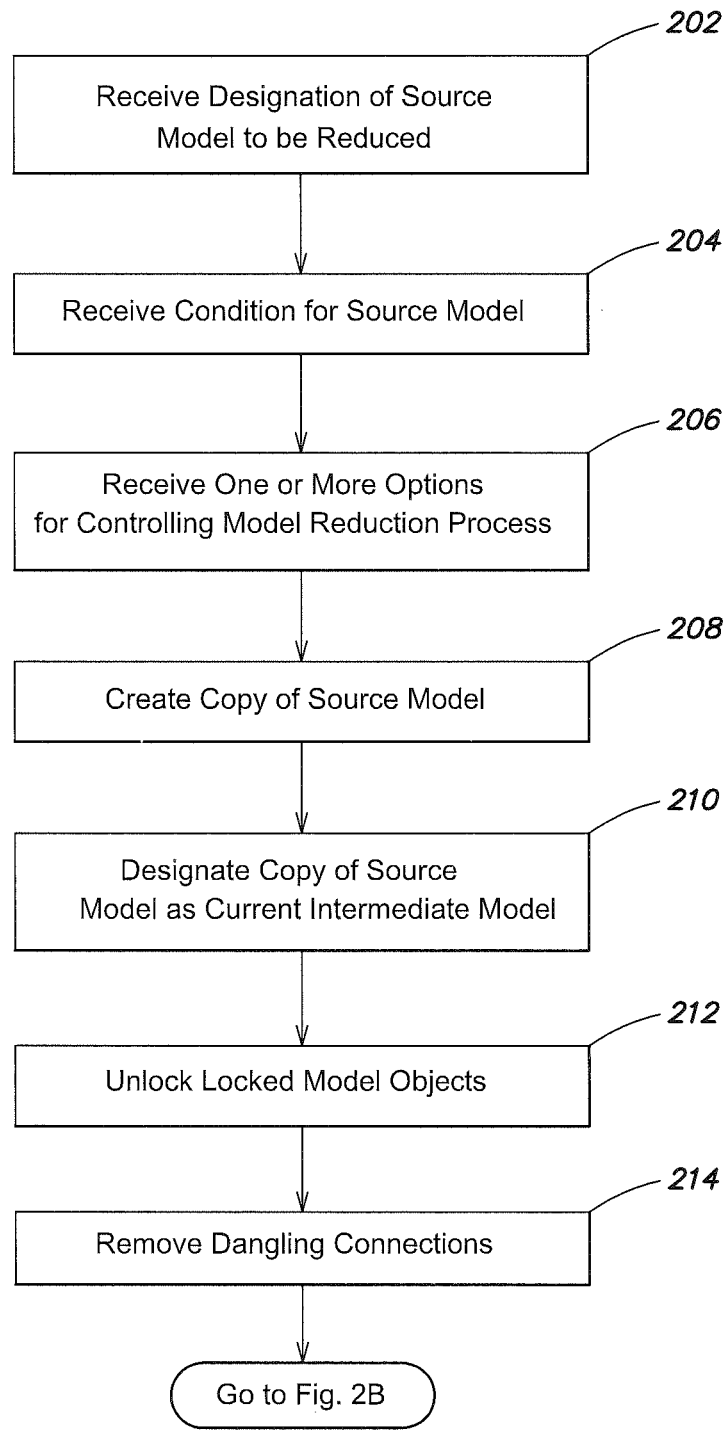
FIGS. 2A-D are a flow diagram of a method in accordance with an embodiment of the invention.
Figure 2B:
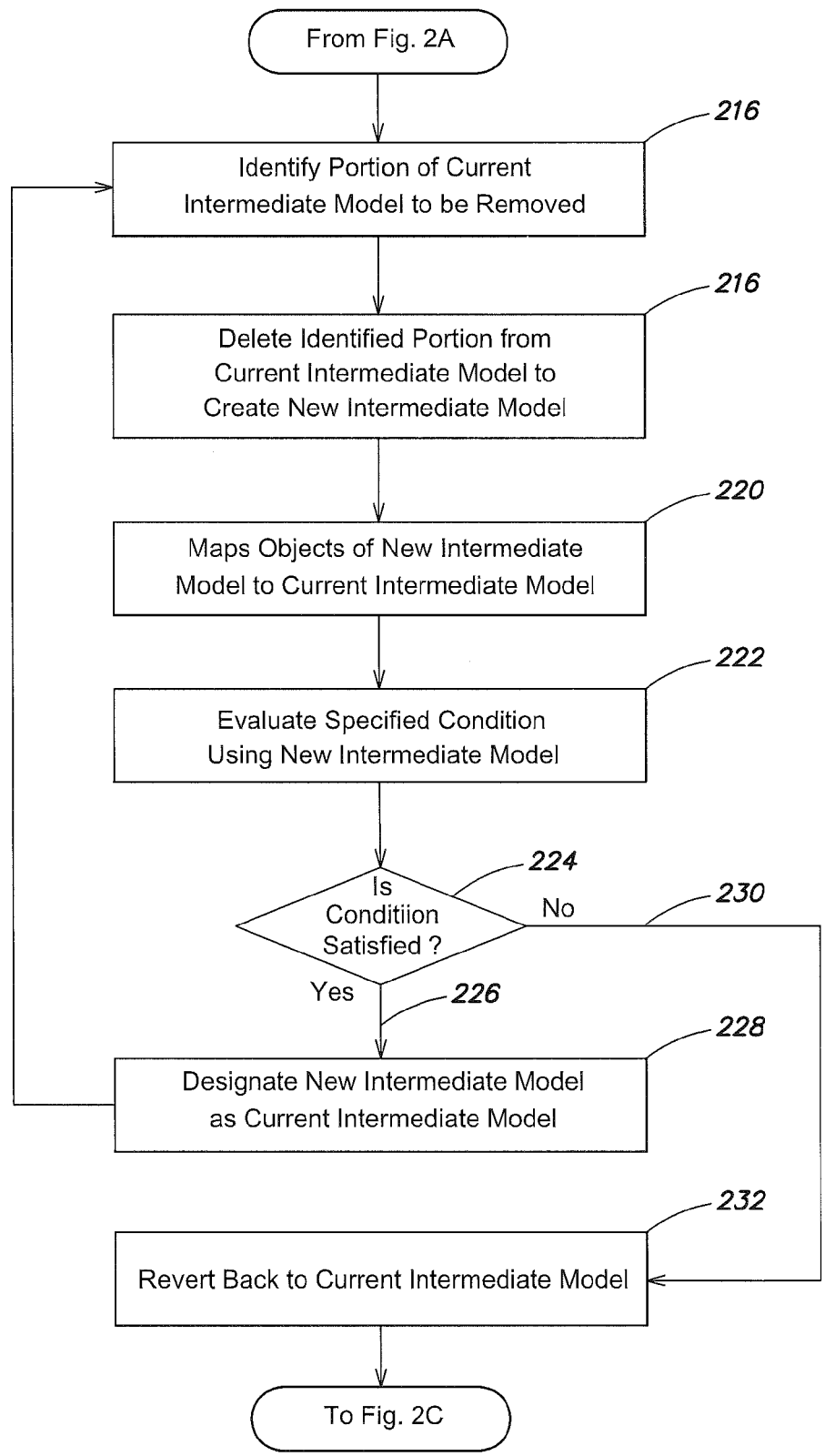

The model search engine 300 may identify a portion of the current intermediate model that is to be deleted, as indicated at block 216 (FIG. 2B). The model search engine 300 may apply one or more algorithms, such as a binary search algorithm, a ternary search algorithm, a linear search algorithm, a random search algorithm, etc., to identify the portion that is to be deleted. The portion to be deleted may correspond to one or more blocks, one or more subsystems, one or more sub-models, etc. The random search algorithm, which may be used with a complicated model, may randomly pick one or more blocks of a model, and the selected blocks may be deleted to produce an intermediate model for evaluation.

The model search engine 300 may utilize one or more built-in functions of the modeling environment 102 to obtain information about the source model 134 and one or more of the intermediate models 138. For example, the modeling environment 102 may provide a first function that, if called on a model, returns one or more model parameters, such as a list of all blocks within the model. In addition, the modeling environment 102 may provide a second function that, if called on a given block of a model, returns one or more block parameters, including a list of blocks whose execution depends on execution of the given block, and a list of blocks on which execution of the given block depends. The model search engine 300 may be configured to call the first and second functions as part of the process of identifying a portion to be deleted.

In another embodiment, the model search engine 300 may analyze an in-memory representation of the source model 134. The in-memory representation may be constructed by the IR builder 122 of the model compiler 120. Specifically, the IR builder 122 may construct one or more in-memory representations, also referred to as intermediate representations (IRs), of the source model 134, which may have a plurality of nodes interconnected by edges. The nodes of the IR, also known as components, represent graphical objects of the source model 134, and the edges of the IR, called signals, represent the connections between the objects of the source model 134. Special nodes, called network instance components (NICs), may be used to provide hierarchy in the IR, for example, by abstractly representing subsystems, model reference blocks, or subcharts of the source model 134. That is, each object of the source model 134 may map to one or more nodes of the IR, and each line or arrow of the source model 134 may map to an edge. One or more of the IRs may be in the form of a hierarchical Data Flow Graph (DFG), such as a Parallel Intermediate Representation.

In an embodiment, the in-memory representation may have a plurality of hierarchically arranged levels. More specifically, the PR may be a top-level of the in-memory representation of the source model 134, and one or more of the components of the PR may be a particular type or form of in-memory representation. For example, one or more components of the PIR may be a Control Flow Graph (CFG), Control Data Flow Graph (CDFG), program structure tree (PST), abstract syntax tree (AST), a netlist, etc. A CDFG may capture the control flow as well as the data flow of a graphical model through data dependency and control dependency edges. The in-memory representation or IR may be stored in memory, such as a main memory.

The model refining engine 126 may delete the identified portion to create a new intermediate model, as indicated at block 218. Since a portion is being deleted, the new intermediate model is smaller than the current intermediate model.

The object mapping engine 130 may map the graphical objects of the new intermediate model 138 to their respective or corresponding blocks in the source model 134, as indicated at block 220. For example, if the model refining engine 126 needs to move or rename blocks, the moved or renamed blocks may be mapped to their corresponding blocks of the source model 134. The model refining engine 126 may store the mapping of blocks of the new intermediate model 138 to the source model 134 in one or more data structures, such as an array, in a memory, such as the main memory of a server or workstation.

The condition evaluation engine 128 may evaluate the specified condition utilizing the new intermediate model 138, as indicated at block 222. That is, the specified condition is evaluated using the new intermediate model rather than the source model 134. In addition, the condition is defined so that it produces, when evaluated, either a first value, such as True, or a second value, such as False.

In an embodiment, model execution may be carried out over a user-specified time span for a set of user-specified inputs. A compile stage may mark the start of model execution and may involve preparing data structures and evaluating parameters, configuring and inferring (e.g., by propagating) block characteristics, determining block connectivity, and performing block reduction and block insertion. The preparation of data structures and the evaluation of parameters may create and initialize basic data-structures needed in the compile stage. For each block, a method may force the block to evaluate all of its parameters. This method may be called for a subset of or all blocks in the model. If there are any unresolved parameters, execution errors or warnings may be thrown. During the configuration and inferring of block and port/signal characteristics, the compiled attributes (such as dimensions, data types, complexity, or sample time) of each block (and/or ports) may be setup on the basis of the corresponding behaviors and the attributes of blocks (and/or ports) that are connected to the given block through lines. For example, the attribute setup may be performed through a process such as, for example, propagation, during which block behaviors "ripple through" the model from one block to the next following signal connectivity.

This process referred to as "propagation" may serve two purposes. In the case of a block that has explicitly specified its block (or its ports') behaviors, propagation helps ensure that the attributes of this block are compatible with the attributes of the blocks connected to it. If not, an error or warning may be issued. Secondly, in many cases blocks are implemented to be compatible with a wide range of attributes. Such blocks may adapt their behavior in accordance with the attributes of the blocks connected to them. This is akin to the concept of polymorphism in object-oriented programming languages. The exact implementation of the block may be chosen on the basis of the model in which the block finds itself. Included within this step are other aspects such as validating that all rate-transitions yield deterministic results, and that the appropriate rate transition blocks are being used. The compilation step also may determine actual block connectivity. For example, virtual blocks may play no semantic role in the execution of a block diagram. In the compilation step, the virtual blocks may be optimized away (removed) and the remaining non-virtual blocks may be reconnected to each other. This compiled version of the model with actual block connections may be used from this point forward in the execution process. The way in which blocks are interconnected in the model does not necessarily define the order in which the equations (methods) corresponding to the individual blocks will be solved (executed). The actual order may be determined during a sorting step in the compilation step. In an embodiment, once the compilation step has completed, the sorted order may not be changed for the entire duration of the model's execution.

The condition evaluation engine 128 may determine whether the condition, when evaluated using the new intermediate model is satisfied, as indicated at decision block 224. That is, whether the condition produces the first value, e.g., True, thereby indicating that the condition is also satisfied by the new intermediate model. If the new intermediate model also satisfies the condition, then the source of the condition is also present in the new intermediate model. That is, the source of the condition is not in the deleted portion. Accordingly, further processing proceeds with the new intermediate model. More specifically, if the new intermediate model satisfies the condition, then the model search engine 300 may designate the new intermediate model as the current intermediate model, as indicated by Yes arrow 226 leading to block 228. Processing may then continue at block 216 (FIG. 2B) where the model search engine 300 may identify a new portion to be deleted.

If, after deleting the identified portion from the current intermediate model to create the new intermediate model, the condition is no longer satisfied, for example evaluation of the condition returns the second value, e.g., False, then the model refining engine 126 may revert back to the just prior version of the model, as indicated by No arrow 230 leading to block 232. For example, the model refining engine 126 may save the current intermediate model, and if the condition is not satisfied by the new intermediate model, the model refining engine 126 may revert back to the saved current intermediate model.

Alternatively, the model refining engine 126 may undo the just performed delete operation. In particular, the model reduction system 110 may keep track of each edit that is made to the source model 134 and the intermediate models by the model refining engine 126. For example, the model reduction system 110 may store the edits in a log. To the extent a change, such as a deletion of a plurality of blocks or a single block, causes the condition to no longer be satisfied, the model reduction system 110 may utilize the log to recover to an earlier intermediate model.

Figure 2C:
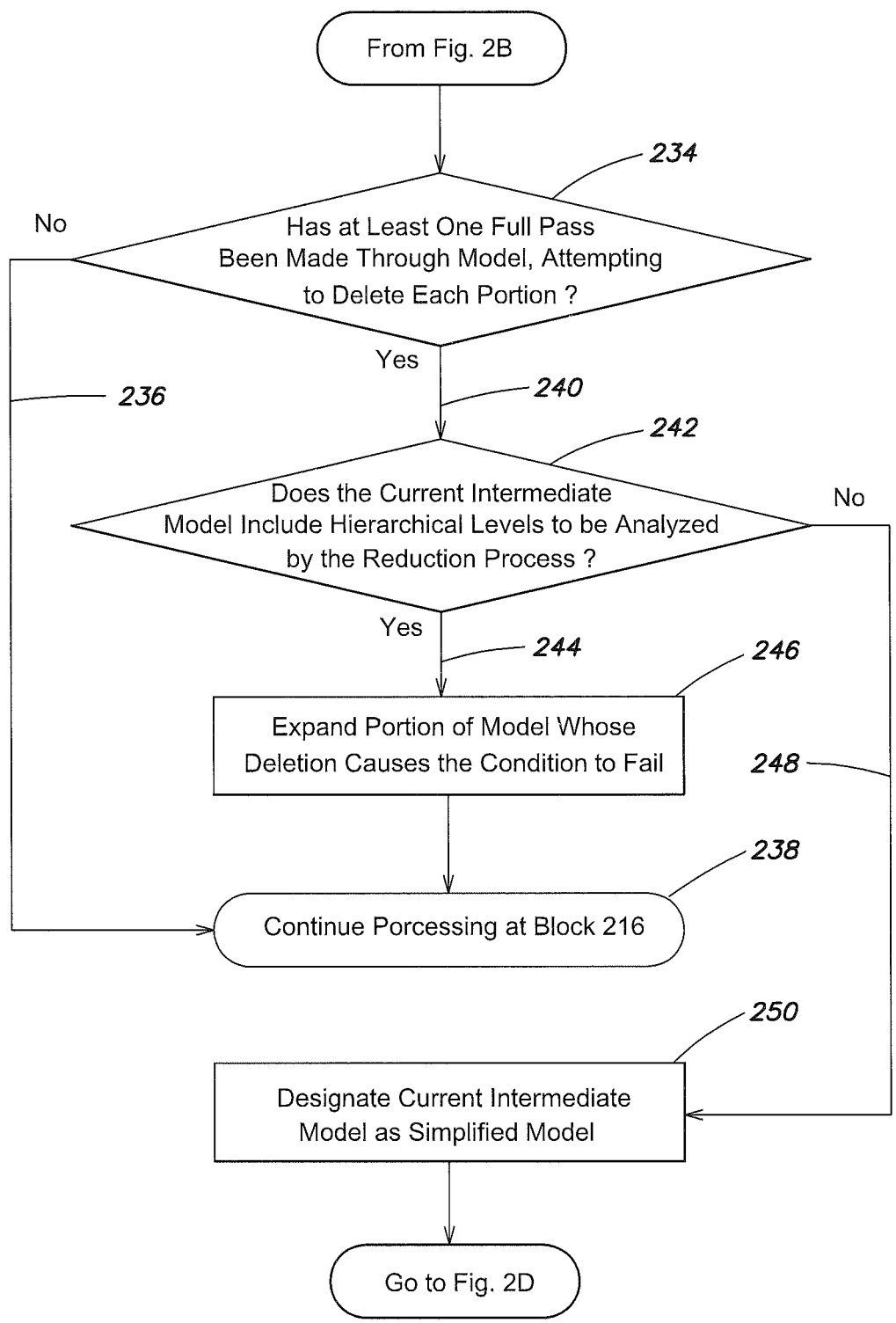

The model search engine 300 may determine whether at least one full pass has been made through the current intermediate model deleting each portion, and checking whether the condition is still satisfied, as indicated at decision block 234 (FIG. 2C). If not, processing may return to block 216, as indicated by No arrow 236 leading to block 238. If at least one full pass has been made through the current intermediate model deleting each portion and determining that no other portion may be deleted without causing the condition to no longer be satisfied by the resulting intermediate model, the model search engine 300 may determine whether the current intermediate model includes any hierarchical levels that have yet to be processed, as indicated by Yes arrow 240 leading to decision block 242. If the current intermediate model includes one or more hierarchical levels yet to be processed, the model refining engine 126 may expand one or more of these hierarchical levels, as indicated by Yes arrow 244 leading to block 246. Processing may then return to block 216 (FIG. 2A), as indicated by block 238, and the model reduction system 110 may determine whether one or more portions of the as yet unprocessed hierarchical levels may be deleted. For example, if the model reduction system 110 determines that it cannot delete a model reference block without causing the condition to no longer be satisfied by the resulting intermediate model, the model reduction system 110 may process the referenced model corresponding to the model reference block, reducing the size of the referenced model. Decision block 242 may be skipped if the user selected the option of not checking hierarchical levels of the source model 134.

Alternatively, the model reduction system 110 may analyze the next hierarchical level of the current intermediate model, rather than expanding the one or more hierarchical levels.

If the model reduction system 110 has processed and attempted to reduce the model's hierarchical levels, the model reduction system 110 may designate the current intermediate model as the simplified model 140, as indicated by No arrow 248 leading to block 250.

Figure 2D:
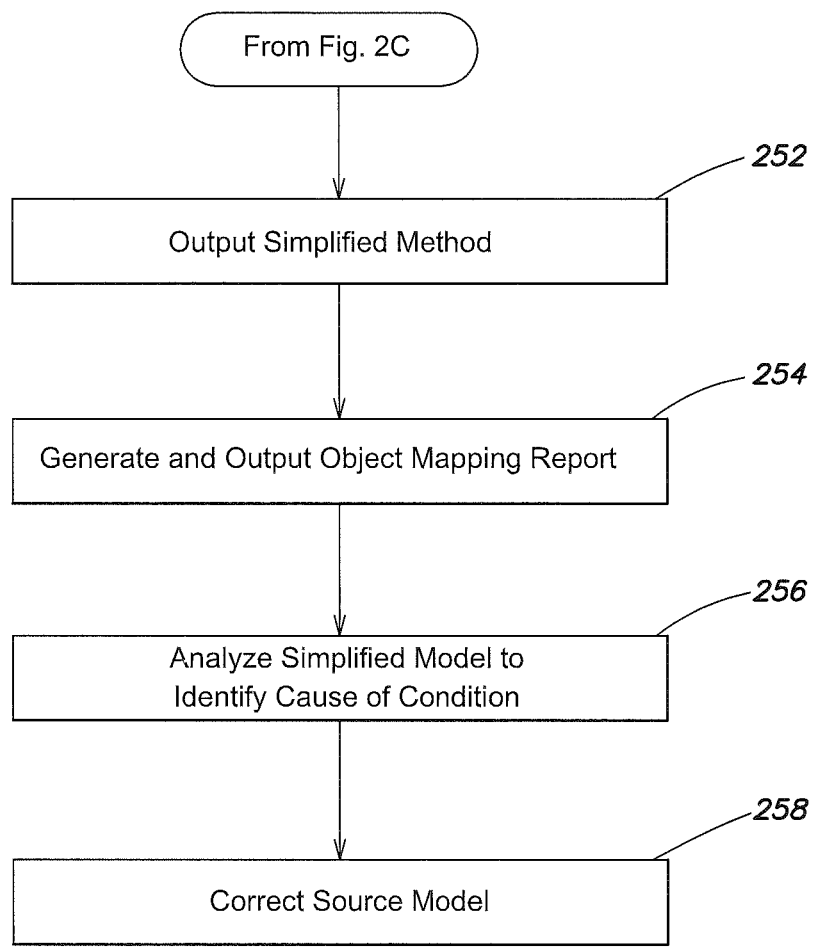

The model reduction system 110 also may output the simplified model 140, as indicated at block 252 (FIG. 2D). The simplified model 140 is (or at least approaches) a smallest size version of the source model 134 for which the specified condition is still satisfied. In an embodiment, smallest size may refer to fewest number of blocks. The model reduction system 110 may output the simplified model 140 by presenting it on a display screen of a workstation or other computer system, or by printing a copy of the simplified model 140.

The object mapping engine 130 may output a report describing the mapping of one or more blocks of the simplified model 140 to the blocks of the source model 134, as indicated at block 254. For example, during the model reduction process, the names and/or locations of one or more blocks may have been changed by the model refining engine 126. Such changes may be tracked by the object mapping engine 130, and indicated in a report that is generated and output by the object mapping engine 130.

The user may analyze the simplified model 140 and the object mapping report to identify a cause of the condition, as indicated at block 256. The analysis may be performed manually, programmatically, or both manually and programmatically. For example, based on experience working with the modeling environment, a user may try and understand the problem in the simplified model, and thus try and fix the problem in the original model. Upon identifying the cause of the condition, the user may correct the source model 134 to generate a revised source model that corrects, e.g., eliminates, the error or undesired condition, as indicated at block 258.

In an embodiment, a user may commence the process of automatically reducing a model through one or more textual commands. More specifically, suppose a model, when executed, generates the following error: Error evaluating parameter 'Gain', and the user wants to locate the source of this error in a large and complex model. The user may create a function, program file or script that defines a specified condition for this error. An exemplary condition function is illustrated below:

1 function condition=my_condition(model_name)
  2 condition=false;
  3 try
  4 sim(model_name);
  5 catch ME
  6 if ~isempty(strifind(ME.message, 'Error evaluating parameter'))
  7 condition=true;
  8 end
  9 end The above program file is written using the MATLAB programming language. Line 1 is a function definition line. It defines the function name, i.e., 'my_condition', and the number and the order of input arguments, i.e., 'model_name', and the number and order of output arguments, i.e., 'condition'. Lines 2-8 represent the function body. Specifically, line 2 initially sets the output argument 'condition' to False. The 'try' and 'catch' portions of the program file execute one or more statements and catch any resulting errors. More specifically, line 4 of the try portion of the program file executes the model named 'model_name'. Lines 6-8 of the catch portion of the program file determine whether execution of the model causes an error condition that includes the statement 'Error evaluating parameter' is thrown and, if so, causes the output argument 'condition' to be assigned the value 'True'. Thus, whenever the my_condition program file is executed, if execution of the model that is input to the program file results in an error that includes 'Error evaluating parameter', the output of the program file, i.e., the variable 'condition,' is True; otherwise the value of the output variable 'condition' is False.

The process of automatically reducing the source model 134 to a smaller version that still results in a condition being satisfied, i.e., the simplified model 140, may be implemented through one or more computer program files or libraries. The program may have the following syntax:

newModel=simplify_model('ModelA', 'my_condition').

Here, the function of the program file is 'simplify_model'. It has two input arguments: a model name, e.g., 'ModelA'; and a condition, e.g., 'my_condition', which itself may be a program file. The 'simplify_model' function has one output argument: a model name, e.g., newModel, which is the simplified version of ModelA that still results in the condition being satisfied.

Figure 3:
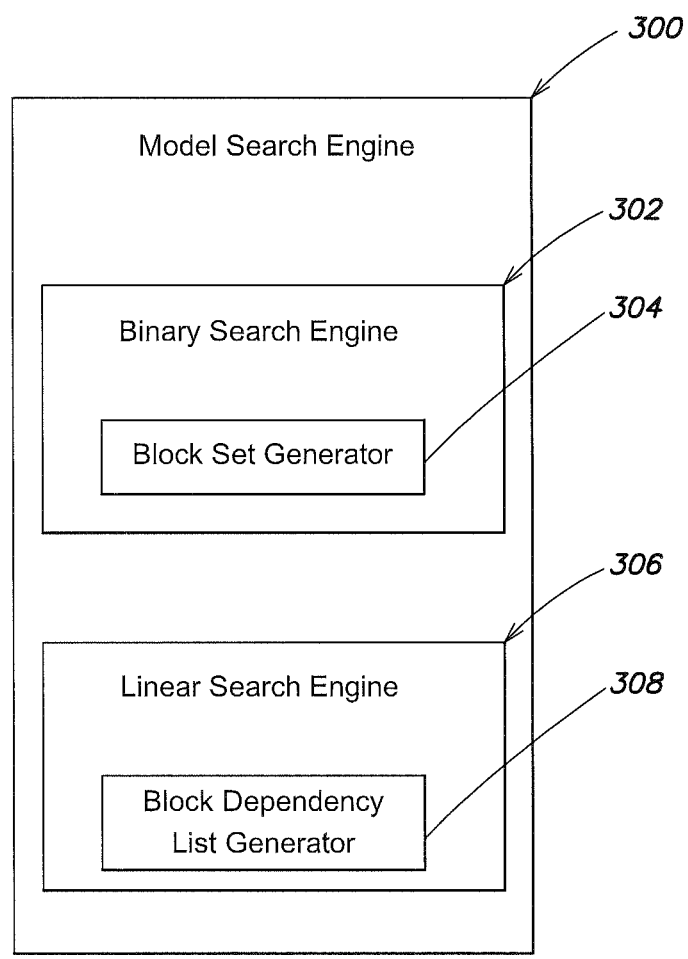
FIG. 3 is a functional diagram of a model search engine in accordance with an embodiment.

FIG. 3 is a functional diagram of the model search engine 300 in accordance with an embodiment. The model search engine 300 may include a binary search engine 302 that includes a block set generator 304. The model search engine 300 also, or alternatively, may include a linear search engine 306 that includes a block dependency list generator 308.

The binary search engine 302 may implement a binary search algorithm to identify one or more groups of blocks for removal from the source model 134. In an embodiment, the binary search engine 302 may identify a first group of blocks for deletion from the source model 134, thereby generating a first intermediate model. The binary search engine 302 may then identify a second group of blocks for deletion from the first intermediate model, thereby generating a second intermediate model, and so on. The binary search engine 302 may continue to identify candidate groups of blocks for deletion until further deletion causes the specified condition to no longer be satisfied.

The linear search engine 306 may implement a linear search algorithm to identify one or more blocks for deletion from the source model 134 or an intermediate model 138. The linear search engine 306 may continue to identify candidate blocks for deletion until further deletion causes the condition to no longer be satisfied.

It should be understood that the binary model reduction process may be performed by a first machine, such as a server, workstation, or virtual machine, while the linear model reduction process may be performed by a second machine that is different from the first machine. It should also be understood that one or more steps may be omitted or replaced.

For example, in an embodiment, the binary model reduction process may be omitted, and just a linear model reduction process may be performed.

Binary Search

Figure 4A:
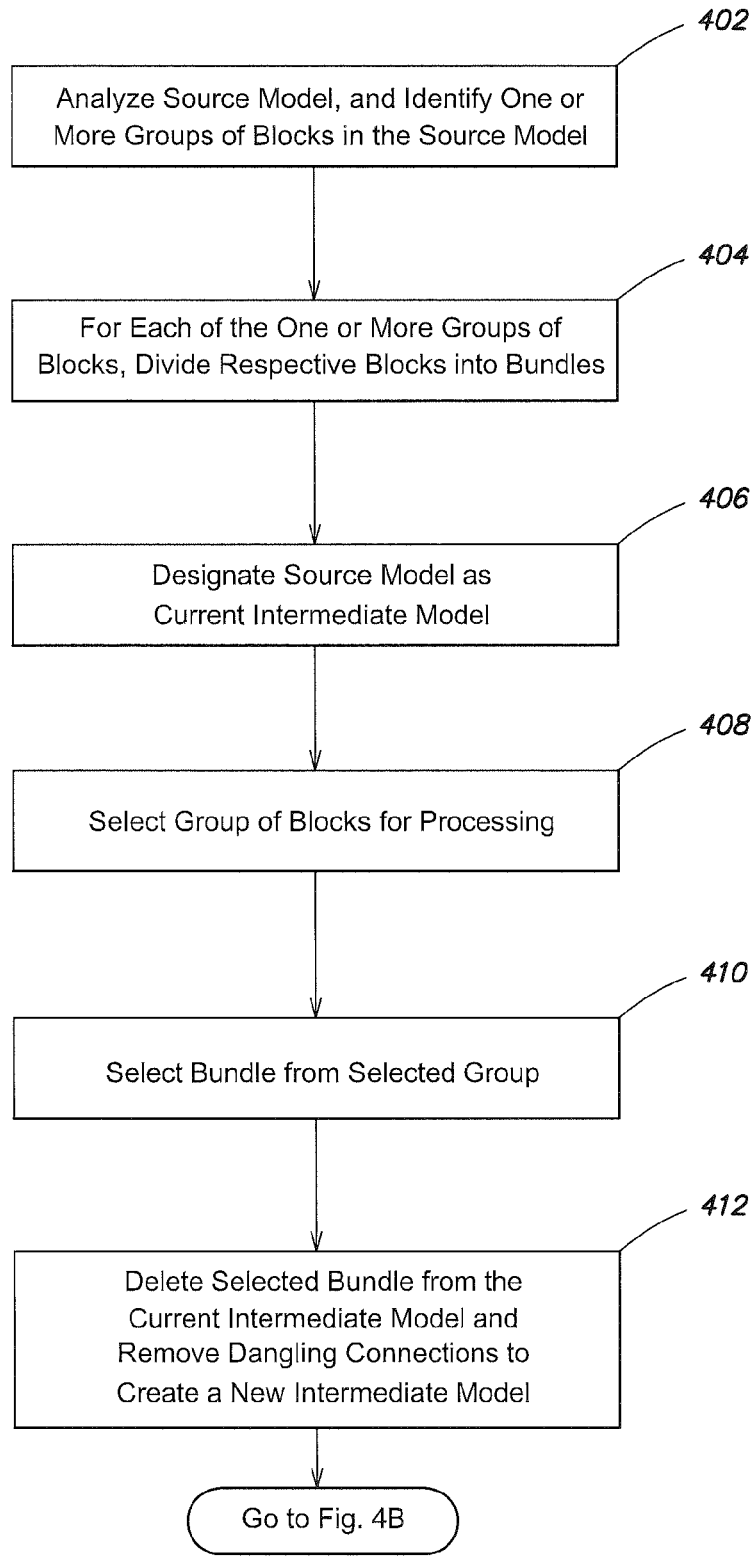
FIGS. 4A-B are a flow diagram of a method in accordance with an embodiment.
Figure 4B:
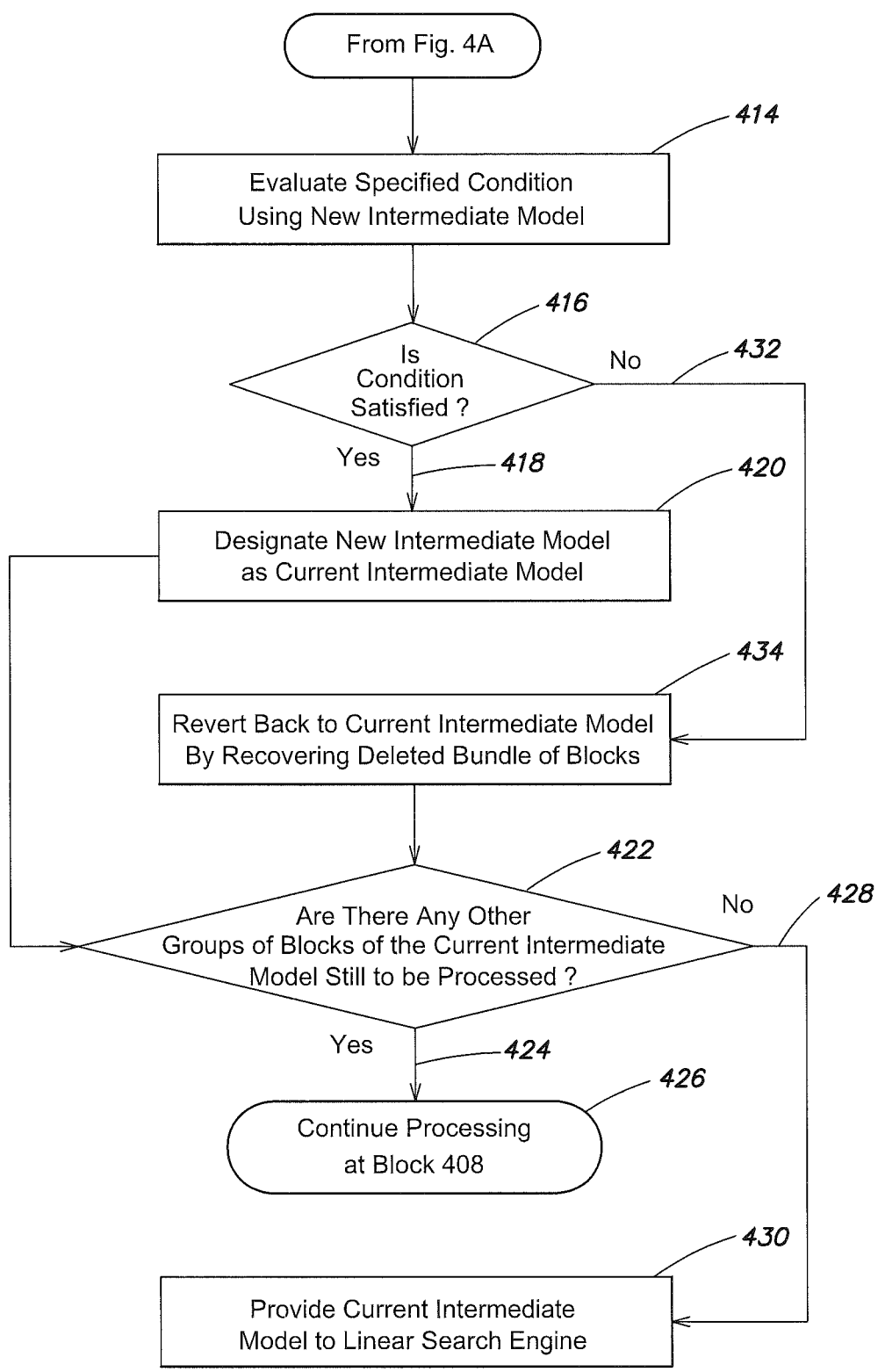

FIGS. 4A-B are a flow diagram of a method for implementing a binary search algorithm in accordance with an embodiment.

The binary search engine 302 may analyze the source model 134, and identify one or more groups of blocks of the source model 134, as indicated at block 402. In an embodiment, each group represents a set of blocks whose execution is independent of the blocks of any other group. For example, if execution dependency is established by connections, such as lines or arrows, between blocks, then a group of blocks is a set of blocks that are connected to each other, but are not connected to any of the blocks of any other group. The source model 134 may contain one or more such groups.

The block set generator 304 may divide the blocks within each group into at least two bundles, as indicated at block 404. In an embodiment, the blocks of each group are divided into two bundles of equal or approximately equal number. For a ternary search algorithm, the blocks of a given group may be divided into three equal or approximately equal bundles. Furthermore, the blocks of a given group may have an execution or dependency order, such as a data and/or control dependency order. For example, suppose the given group includes six blocks. The execution order may be 1→2→3→4→5→6. That is, execution of block #6 occurs after execution of block #5, whose execution occurs after execution of block #4, whose execution occurs after execution of block #3, and so on to block #1.

In an embodiment, each bundle constitutes a plurality of blocks from the group having a sequential and contiguous, i.e., uninterrupted, execution order among themselves. Continuing with the example, a first bundle may consist of blocks 1→2→3, while a second bundle may consist of blocks 4→5→6. In an embodiment, a bundle should not include, for example, blocks 2, 4, and 6, because they do not have a sequential and contiguous execution or dependency order. If there is a cyclic dependency among the blocks, such as A→b→c→A, the binary search engine 302 may select the first block as the starting point and stop at the point just before the cycle, for example, the binary search engine 302 may select A→b→c as a bundle.

The two or more bundles of a given group may have an execution order. That is, the execution of one bundle may depend on the execution of another bundle. Following the above example, execution of the second bundle, i.e. blocks 4→5→6, depends on execution of the first bundle, i.e., blocks 1→2→3. That is, execution of the second bundle occurs after execution of the first bundle.

The binary search engine 302 may designate the source model 134 as the current intermediate model, as indicated at block 406. Next, the binary search engine 302 may designate or select one of the groups for processing, as indicated at block 408. In an embodiment, the binary search engine 302 may organize the groups based on the number of blocks within each group. The binary search engine 302 then may select groups in a decreasing order of number of blocks, for example, the binary search engine 302 may start with the group having the largest number of blocks. The binary search engine 302 may select one of the bundles from the selected group, as indicated at block 410. As mentioned, the blocks of each group may be organized into two bundles, and the execution of the blocks of a second bundle may depend upon, e.g., follow, the execution of the blocks of a first bundle. The binary search engine 302 may select the second bundle, i.e., the bundle whose execution is dependent upon the other bundle.

The model refining engine 126 may delete the blocks of the selected bundle from the current intermediate model, thereby creating a new intermediate model, as indicated at block 412. In particular, the model refining engine 126 may delete the blocks and their connections from the current intermediate model. Returning to the above example, while the current intermediate model included blocks 1→2→3→4→5→6, the new intermediate model only includes blocks 1→2→3. Blocks 4→5→6 are deleted.

The condition evaluation engine 128 may evaluate the specified condition using the new intermediate model, as indicated at block 414 (FIG. 4B). The condition evaluation engine 128 determines whether the condition, when evaluated using the new intermediate model, is satisfied, for example whether it produces the first value, e.g., True, as indicated at decision block 416. If the new intermediate model satisfies the specified condition, further processing proceeds with the new intermediate model. More specifically, the binary search engine 302 may designate the new intermediate model as the current intermediate model, as indicated by Yes arrow 418 leading to block 420. The binary search engine 302 may then determine whether there are any other groups of blocks of the current intermediate model that still need to be processed, as indicated at decision block 422. For example, suppose the source model 134 was organized into four groups, and that one of the groups has been selected and processed. In this case, three other groups remain to be processed. In addition, because the model includes a plurality of groups of blocks, the model reduction system 110 may attempt to remove both bundles from at least some of the groups. If there is one or more other groups still to be processed, processing may return to block 408 (FIG. 4A) as indicated by Yes arrow 424 leading to block 426. In other words, another iteration of the binary search process may be performed.

If all of the groups of blocks have been processed, then processing by the binary search engine 302 may be considered to be complete. In an embodiment, the binary search engine 302 may provide the current intermediate model to the linear search engine 306 for additional processing, as indicated by No arrow 428 (FIG. 4B) leading to block 430.

Returning to decision block 416 (FIG. 4B) if, after deleting a bundle to create a new intermediate model, the condition is no longer satisfied, for example evaluation of the condition returns the second value, e.g., False, then the model refining engine 126 may revert back to the just prior version of the model, as indicated by No arrow 432 leading to block 434. In other words, removing the subject bundle results in the condition no longer being satisfied. Accordingly, the subject bundle may be returned to the model. Processing may continue at block 422 such that the binary search engine 302 may determine whether other groups of blocks remain to be processed, and if so, the binary search engine 302 may continue to try and decrease the size of the current intermediate model.

Figure 16:
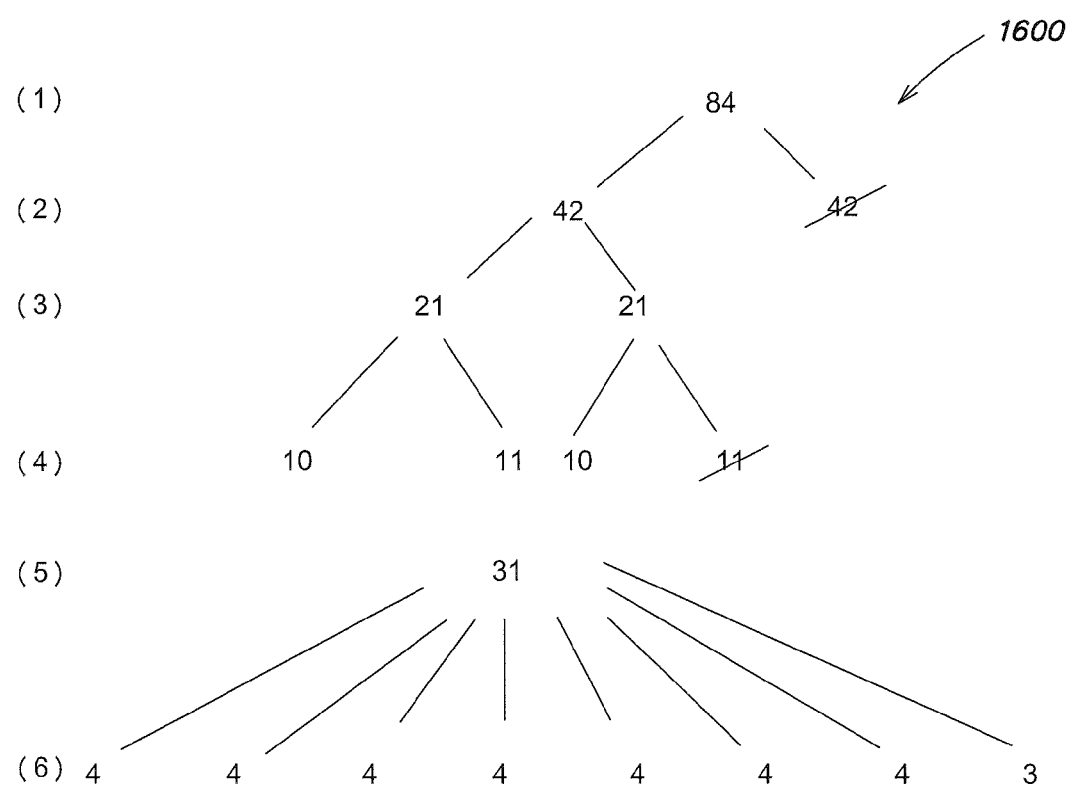
FIG. 16 is a schematic illustration of a binary tree in accordance with an embodiment of the invention.

As an example, suppose a source model has a group containing 84 blocks. FIG. 16 is a schematic illustration of a binary tree 1600 created by the binary search engine 302. As indicated at level 1 of the tree 1600, the model may contain 84 blocks. As indicated at level 2, the binary search engine 302 may create two bundles each containing 42 blocks. Suppose that the second bundle of 42 blocks may be successfully deleted from the source model, as indicated by the line through the second 42. Next, the binary search engine 302 may create two bundles each having 21 blocks, as indicated at level 3 of the binary tree 1600. Suppose neither bundle of 21 blocks may be deleted. In an embodiment, the binary search engine 302 may divide each bundle of 21 blocks into two bundles. Thus, instead of having two bundles of 21 blocks, the binary search engine 302 may create four bundles having ten, eleven, ten, and eleven blocks respectively, as indicated at level 4 of the binary tree 1600. Suppose out of the four bundles that only the second bundle of eleven blocks may be deleted, thereby leaving the three bundles of ten, eleven, and ten blocks, respectively, as indicated by the line through the last 11 at level 4. Because the binary search engine 302 had just previously created four bundles and was only able to delete one of these bundles, the binary search engine 302 may be configured to aggregate the remaining, i.e., 31 blocks, as indicated at level 5 of the tree 1600, and create eight bundles from the entire 31 remaining blocks, as indicated at level 6 of the tree 1600. The binary search engine 302 may then try deleting each of these eight bundles of blocks one at a time.

Linear Search

As mentioned, the model search engine 300 may implement a linear search process following the binary search process.

Figure 5A:
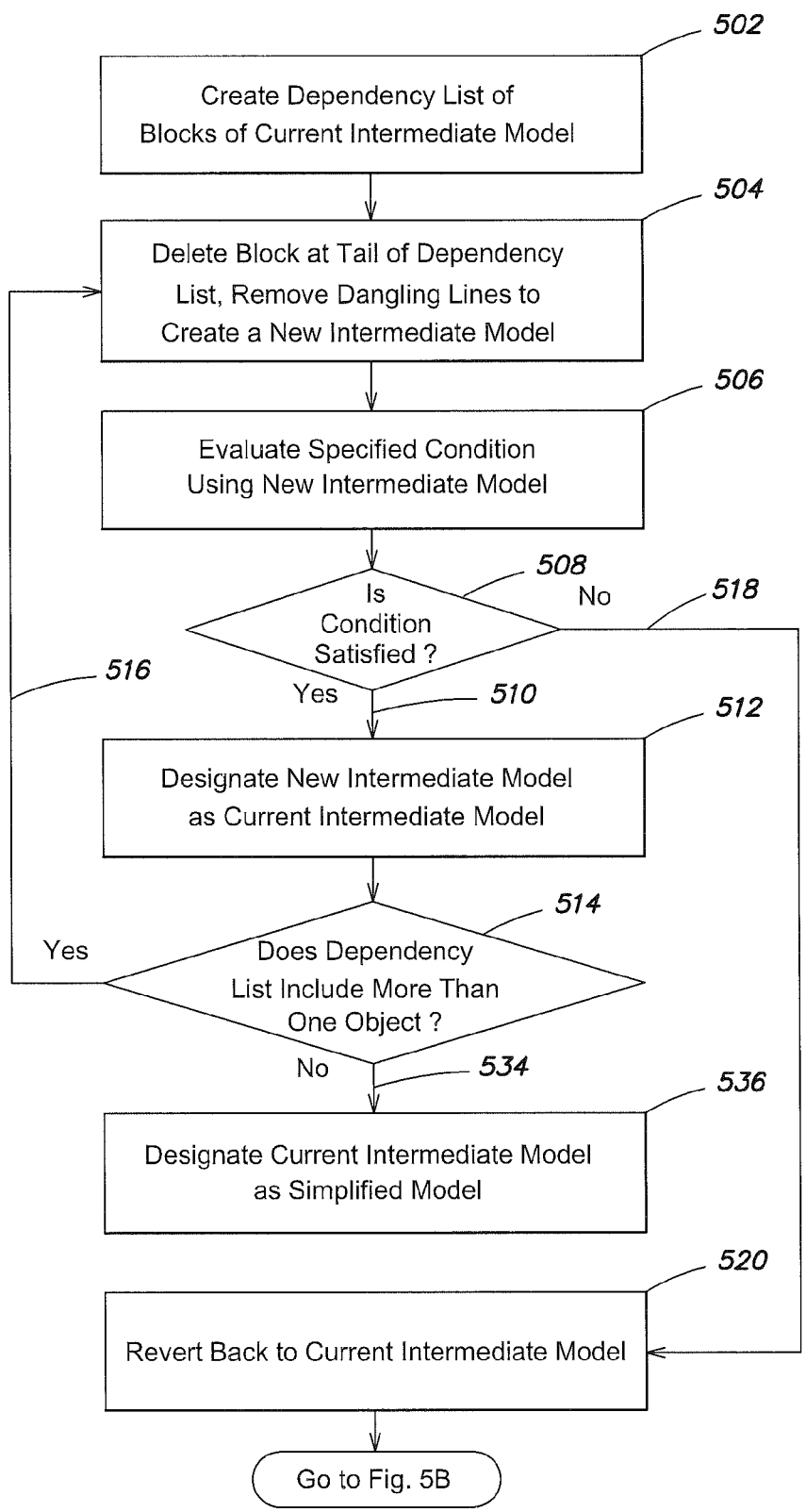
FIGS. 5A-B are a flow diagram of a method in accordance with an embodiment.
Figure 5B:
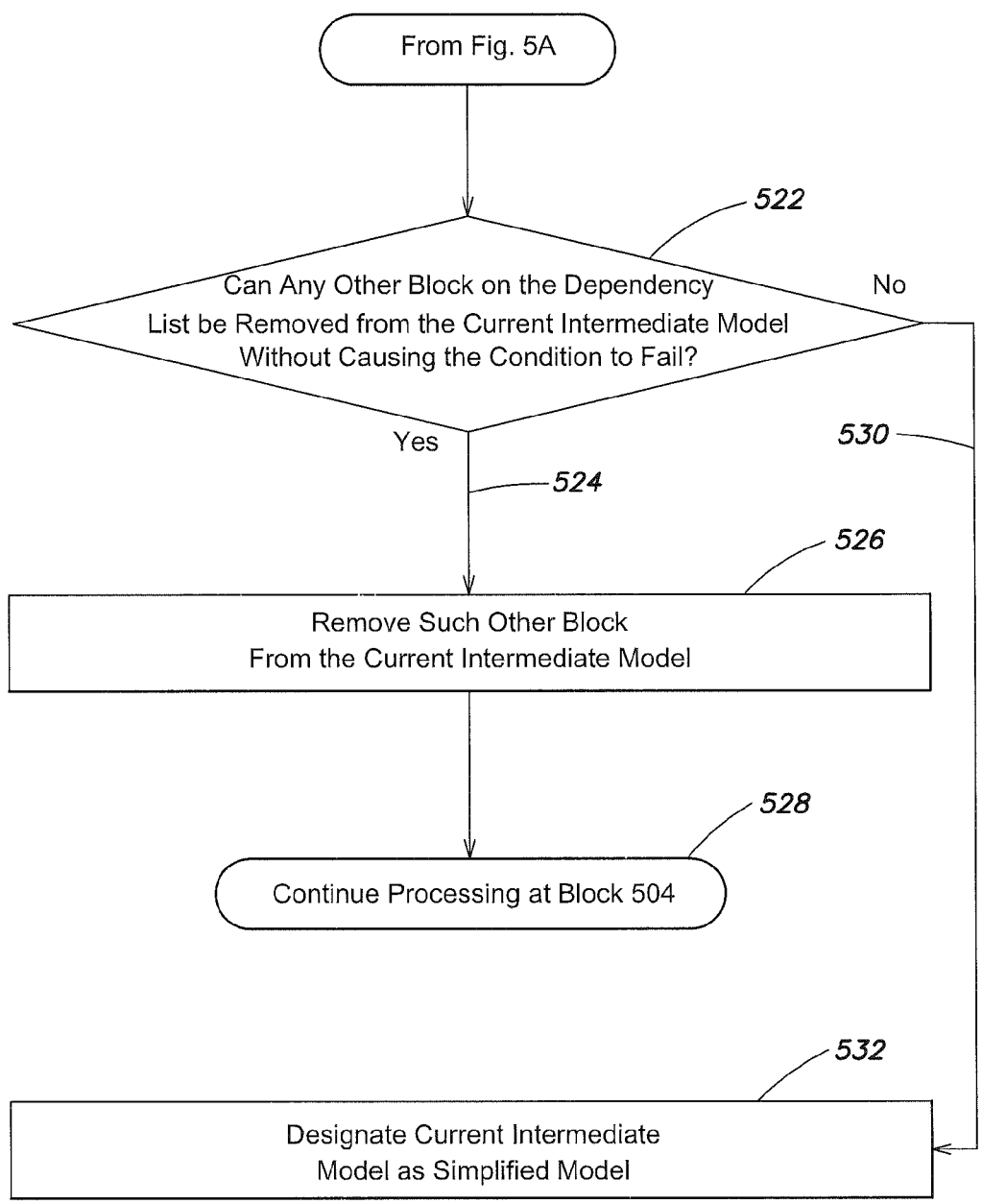

FIGS. 5A-B are a flow diagram of a method for implementing a linear search process in accordance with an embodiment of the invention.

The block dependency list generator 308 may generate a dependency order list of the blocks of the current intermediate model, as indicated at block 502. The dependency order may be a data and/or a control dependency order, or an execution order. In an embodiment, the block dependency list generator 308 may utilize one or more functions of the modeling environment 102 to create the list. Source blocks will generally appear at or near the head of the dependency list, and sink blocks will generally appear at or near the tail of the dependency list. A source block is a block that has no inputs, such as a Sine Wave block, an Inport block, etc. A sink block is a block that has no outputs, such as an Outport block, a To Workspace block, etc.

In another embodiment, the block dependency list generator 308 may use the sorted order generated by the simulation engine 108 during execution of the source model 134.

The linear search engine 306 may delete the block at the end, i.e., at the tail, of the dependency order list, thereby creating a new intermediate model, as indicated at block 504. The linear search engine 306 also may remove any dangling connections from the new intermediate model, as also indicated at block 504.

The condition evaluation engine 128 may then evaluate the specified condition using the new intermediate model, as indicated at block 506. The specified condition is evaluated using the new intermediate model. The condition evaluation engine 128 determines whether the condition, when evaluated using the new intermediate model, is satisfied or not, as indicated at decision block 508. If the new intermediate model satisfies the specified condition, then the source of the condition is also present in the new intermediate model. Accordingly, further processing proceeds with the new intermediate model. More specifically, if the new intermediate model satisfies the condition, then the linear search engine 306 may designate the new intermediate model as the current intermediate model, as indicated by Yes arrow 510 leading to block 512. The linear search engine 306 may then determine whether the dependency order list includes more than one object, as indicated at decision block 514. If there are multiple blocks on the dependency order list, processing may return to block 504, as indicated by Yes arrow 516. In this manner, another iteration of the linear search process may be performed.

Returning to decision block 508, if, after deleting the block at the tail of the dependency order list, the condition is no longer satisfied, then the model refining engine 126 may revert back to the just prior version of the model, as indicated by No arrow 518 leading to block 520. The linear search engine 306 may then determine whether any other block from the dependency order list may be removed from the current intermediate model without causing the condition to fail, as indicated at decision block 522 (FIG. 5B). In other words, the linear search engine 306 may make a full pass through the dependency order list trying to remove at least one block and still have the condition be satisfied when evaluated against the resulting intermediate model. If such a block is identified, it may be removed by the model refining engine 126, as indicated by Yes arrow 524 (FIG. 5B) leading to block 526, and processing may continue at block 504 (FIG. 5A), as indicated at block 528.

If the removal of each block on the dependency order list from the current intermediate model causes the condition not to be satisfied, then the linear search engine 306 may designate the current intermediate model as the simplified model, as indicated by No arrow 530 leading to block 532.

Returning to decision block 514 (FIG. 5A), if the dependency order list is reduced to a single block, then the linear search engine 304 may designate the current intermediate model as the simplified model, as indicated by No arrow 534 leading to block 536.

This process may be performed at each hierarchical level.

Exemplary Source and Simplified Models

Figure 6:
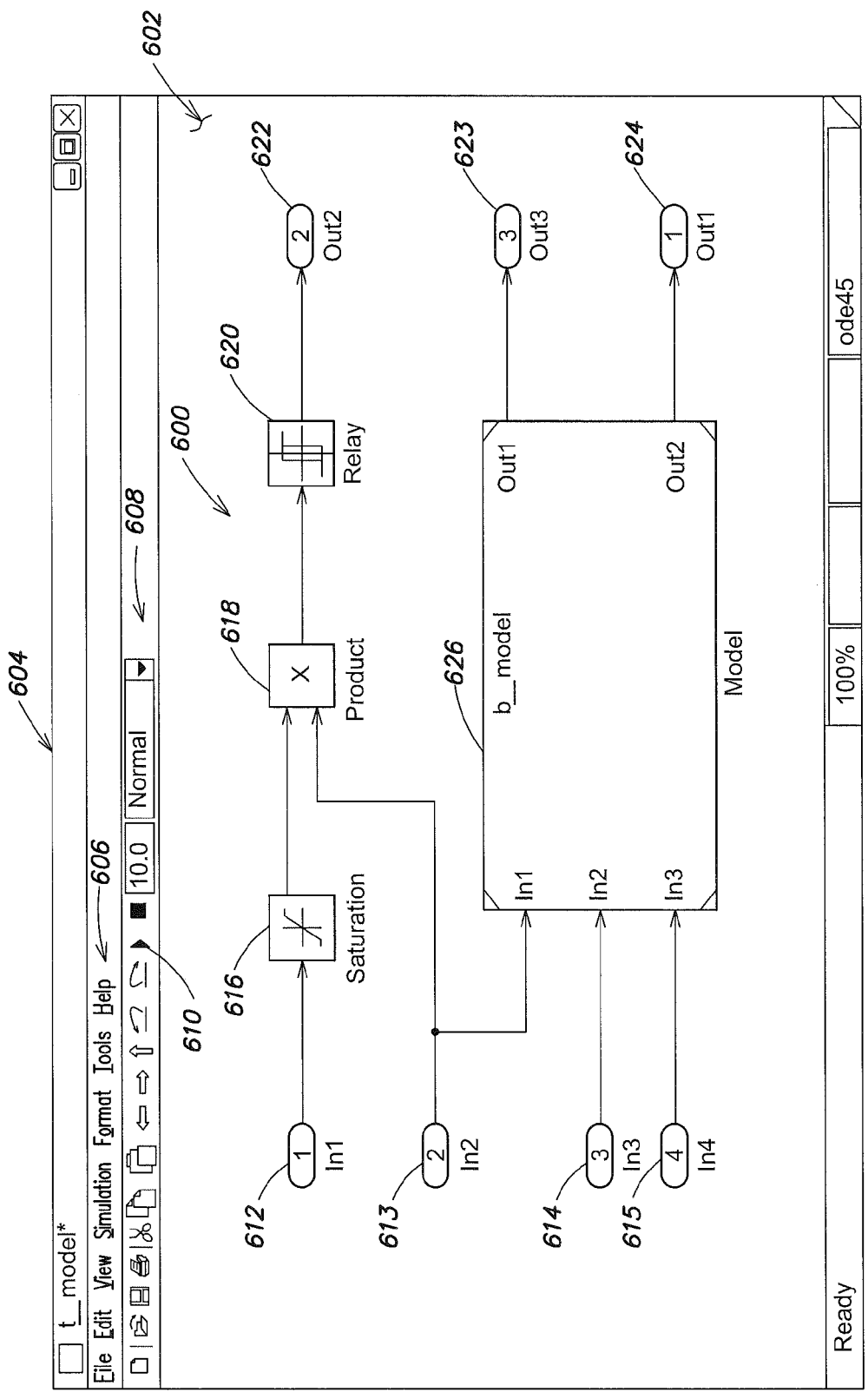
FIG. 6 is a schematic illustration of a source model in accordance with an embodiment of the invention.

FIG. 6 is a schematic illustration of a computer-generated graphical model 600 having executable semantics. The model 600, whose name is 't_model', may be constructed on a model canvas 602 of a model editor 604, which may be part of a Graphical User Interface (GUI) that may be arranged as a desktop environment. In addition to the canvas 602, the model editor 604 may include a menu bar 606, and a toolbar 608, among other graphical elements. The toolbar 608 may include a Run button 610, among other command buttons. In response to a user selecting the Run button 610, the simulation engine 108 may execute the model 600.

The model 600, which may comply with the Simulink modeling environment, may represent a physical system.

Figure 7:
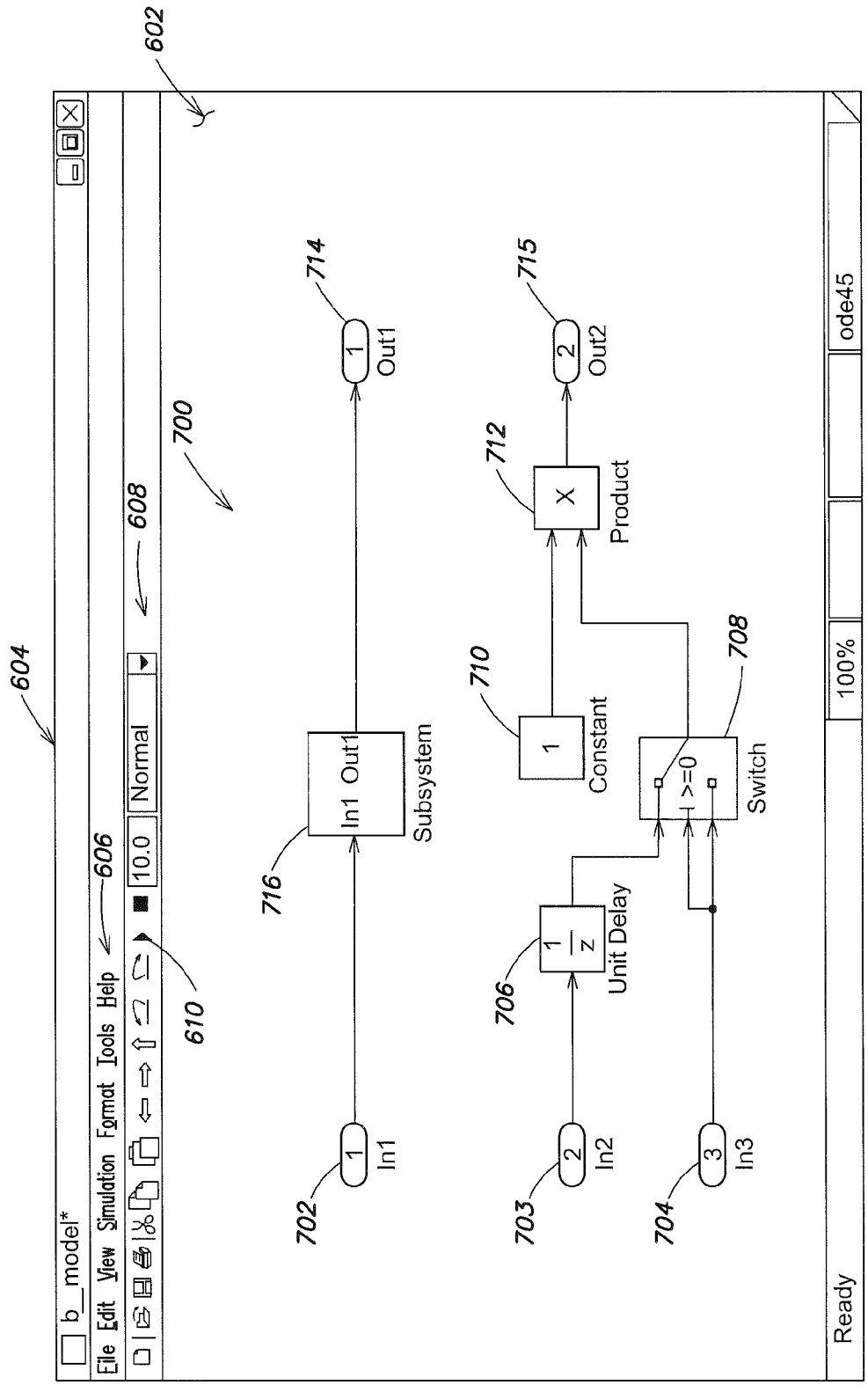
FIG. 7 is a schematic illustration of a sub-model of the source model of FIG. 6.

The model 600 may include a plurality of graphical objects, such as blocks, interconnected by connection lines, such as arrows. Specifically, the model 600 may include four Inport blocks 612-615 (In1, In2, In3, and In4), a saturation block 616, a Product block 618, a Relay block 620, and three Outport blocks 622-624 (Out2, Out3, and Out1). The model 600 may also include a model reference block 626 that represents a referenced model 700 (FIG. 7).

To improve readability especially of large complex models, a model developer may choose to represent a set of blocks by a single block within a model. This single block may be referred to as a subsystem block. Subsystem blocks may contain other subsystem blocks, thereby establishing multiple hierarchical levels within the model. Once created, a subsystem block may be saved in a library of the modeling environment 102 for re-use in other graphical models.

A model also or alternatively may include one or more partitions. For example, a first model, referred to as a parent model, may contain one or more other models, referred to as referenced models or sub-models. A referenced model may be a stand-alone graphical model that is incorporated into the parent model. A referenced model may be executed itself, receiving input data, processing that data, and generating results. The referenced model may be represented graphically by a single block, called a model reference block, within the parent model. A referenced model may itself include one or more other referenced models and/or subsystems.

Subsystem and model reference blocks may have different characteristics. For example, a subsystem block may be context dependent. Accordingly, at least some of the subsystem's attributes may be left undefined. For example, data types, data dimensions, sample times, etc. of at least some of the blocks of a subsystem may be left undefined. Particular values for these attributes may be inherited from the graphical model into which the subsystem is added. In addition, the blocks of a subsystem may not execute atomically relative to the model in which it is located. Instead, execution of the blocks of a subsystem may be interleaved with the execution of other blocks of the model in which the subsystem is located. In contrast, a referenced model may have well-defined attributes, such as data types, data dimensions, solver, sample times, etc., and may not be context dependent. A referenced model may also execute atomically within the parent model. In addition, because it may execute atomically and have well-defined attributes, code may be generated directly from a referenced model, unlike a subsystem. Similar to a referenced model, a subsystem may have a parameter to set the subsystem to execution to be atomic. A model reference block may also support incremental loading and incremental code generation.

FIG. 7 is a schematic illustration of the referenced model 700 represented by the model reference block 626 (FIG. 6) of the model 600. The referenced model 700 may include a plurality of blocks interconnected by arrows. Specifically, the referenced model 700 may include three Inport blocks 702-704 (In1, In2, and In3), a Unit Delay block 706, a Switch block 708, a Constant block 710, a Product block 712, and two Outport blocks 714, 715 (Out1, Out2). The Inport blocks 702-704 correspond to the inputs to the model reference block 626 (FIG. 6), and the Outport blocks 714, 715 correspond to the outputs of the model reference block 626. The referenced model 700 also includes a subsystem block 716 that represents a subsystem 800 (FIG. 8).

Figure 8:
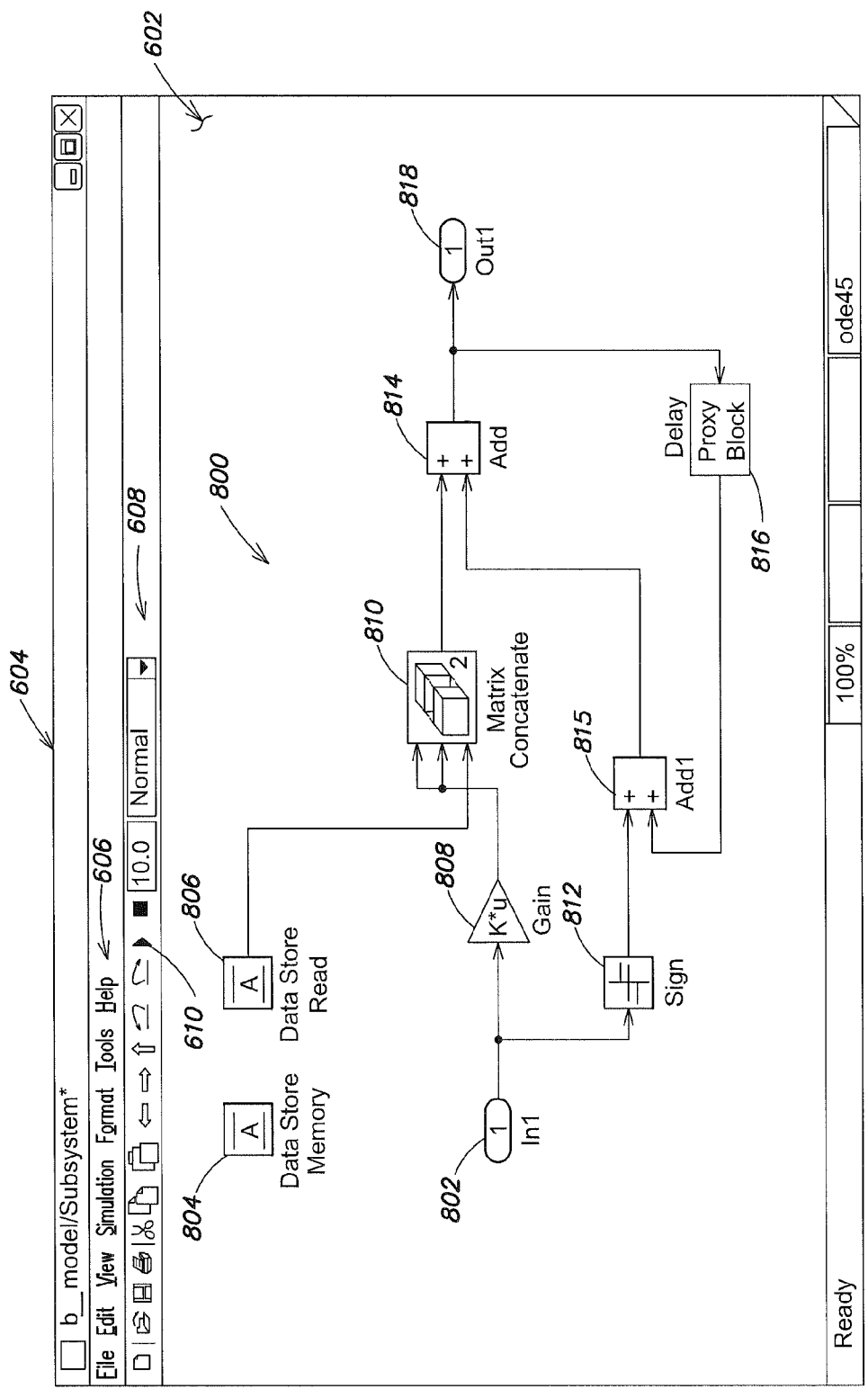
FIG. 8 is a schematic illustration of a subsystem of the sub-model of FIG. 7.

FIG. 8 is a schematic illustrate of the subsystem 800 represented by the subsystem block 716. The subsystem 800 may include an Inport block 802 (In1), a Data Store Memory block 804, a Data Store Read block 806, a Gain block 808, a Matrix Concatenate block 810 a Sign block 812, two Add blocks 814, 815 (Add, Add1), a Delay block 816, and an Outport block (Out1) 818.

The 't_model' model 600 may be considered to be at a top or first hierarchical level. The referenced model 700 may be considered to be at a second hierarchical level, and the subsystem 800 may be considered to be at a third hierarchical level.

When a user attempts to run the model 600, the execution may fail. The simulation engine 108, moreover, may generate one or more error messages that may be displayed to the user, e.g., on a desktop environment. The displayed error messages may be: "matrix gain dimensions mismatch" and "Port Dimensions mismatch".

To identify the cause or source of these errors, the user may employ the model reduction system 110 to automatically create a simplified model from the model 600 that also fails to execute, and generates the "matrix gain dimensions mismatch" and "Port Dimensions mismatch" error messages, where the simplified model is smaller in size than the model 't_model' 600.

Figure 9:
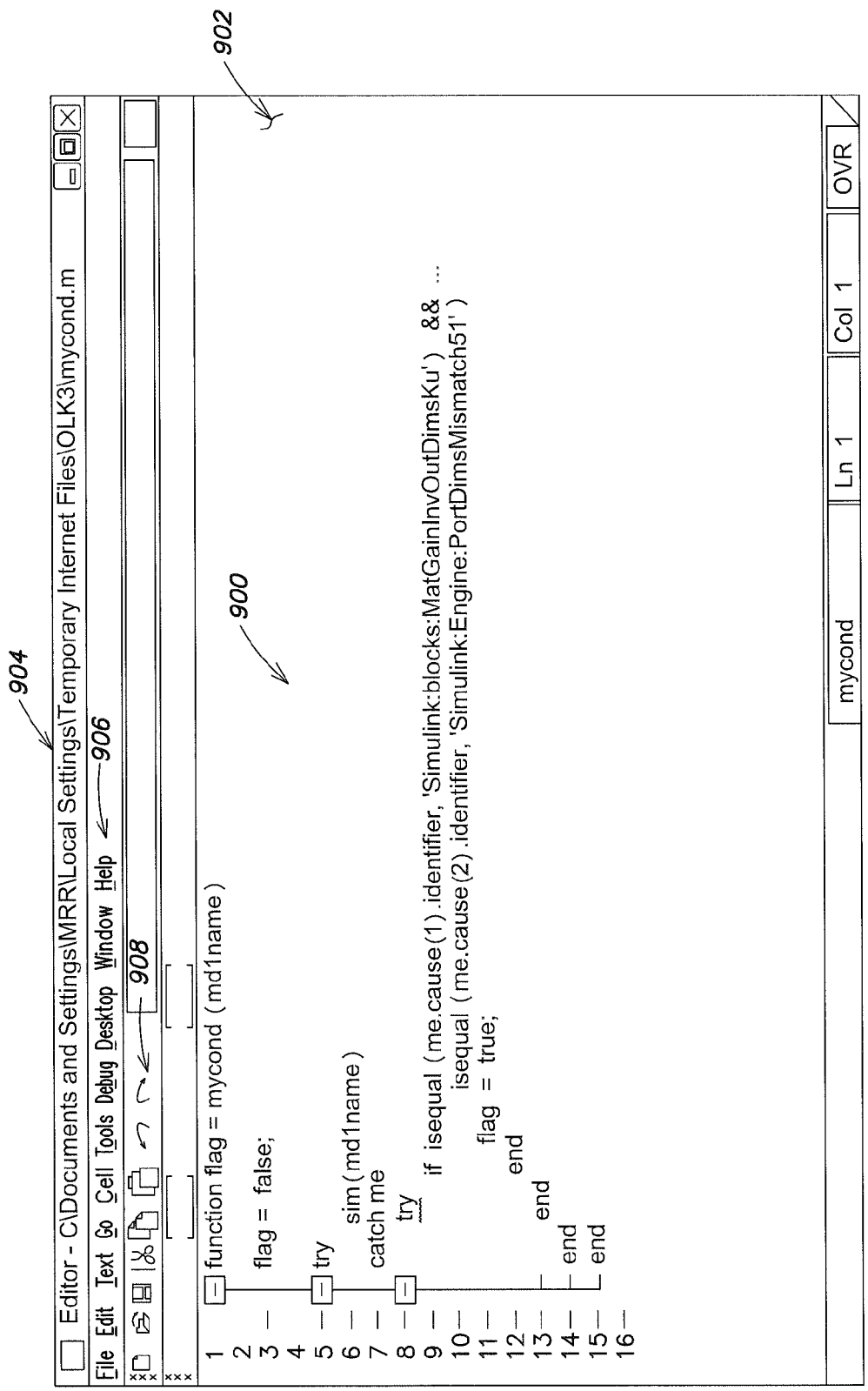
FIG. 9 is a schematic illustration of a condition function in accordance with an embodiment of the invention.

FIG. 9 is a schematic illustration of a condition function 900 created by a user. The condition function 900 may be specified textually according to a programming language, such as the MATLAB language. The condition function 900 may be created in an editor window 902 of an editor 904. The editor 904, which may be part of a GUI, may include a menu bar 906, and a toolbar 908, among other graphical elements.

The condition function 900 may include a plurality of lines of code, e.g., source code, written in the syntax and semantics of a programming language, e.g., the MATLAB language. At line 1, the 'function' function may be used define the condition function 900, which is called 'mycond', and to specify that the 'mycond' function receives an input argument called 'mdlname', which may be the name of a model, and generates an output argument called 'flag'. At line 3, the output argument 'flag' is set to the value 'False'. At line 6, the input model is executed. At lines 9-10, the condition function determines whether the execution of the model results in the "matrix gain dimensions mismatch" and "Port Dimensions mismatch" error messages being generated. If so, the output argument 'flag' is set to True. Otherwise, the output argument 'flag' is left as False.

The user may direct the model reduction system 110 to reduce the size of the model 600, but still result in the errors. For example, the user may enter the following command:

newModel=simplify_model('t_model', 'mycond').

As described, the model reduction system 110 may automatically begin removing portions of the model 600, and determining whether the resulting intermediate model(s) also produce the same errors when executed. For example, the model reduction system 110 may determine that the Inport 612, Saturation 616, Product 618, Relay 620, and Outport 622 blocks may all be successfully removed, i.e., the resulting intermediate model also produces the error messages when executed. However, the model reduction system 110 may determine that, when the model reference block 626 is removed, execution of the resulting model does not result in the "matrix gain dimensions mismatch" and "Port Dimensions mismatch" error messages being generated. Accordingly, the model reduction system 110 may return the model reference block 626 to the current intermediate model.

The model reduction system 110 may determine that the model reference block 626 represents another hierarchical level of the model 600. In response, the model reduction system 110 may begin analyzing the referenced model 700 to see whether any of the blocks of the referenced model may be safely removed. In this case, the model reduction system may determine that the Inport (In2) 703, Inport (In3) 704, Unit Delay 706, Switch 708, Constant 710, Product 712, and Outport 715 blocks may all be successfully removed. However, when the model reduction system 110 removes the subsystem block 716, it may determine that the condition is no longer satisfied by the resulting model. Accordingly, the model reduction system 110 may return the subsystem block 716 to the current intermediate model.

The model reduction system 110 may determine that the subsystem block 716 also represents another hierarchical level of the model 600. In response, the model reduction system 110 may begin analyzing the subsystem 800 represented by the subsystem block 716. The model reduction system 110 may determine that the Sign 812, Add 814, Add1 815, and Delay 816 blocks may all be removed, and the condition may still be satisfied by the resulting model. The model reduction system 110 may likewise determine that if any of the remaining blocks of the subsystem 800 are removed, that the resulting intermediate model no longer satisfies the condition, i.e., execution of the resulting intermediate model does not produce the "matrix gain dimensions mismatch" and "Port Dimensions mismatch" error messages.

Accordingly, the model reduction system 110 may designate this last intermediate model as the simplified model for the input or source model 600, and may output the simplified model, e.g., to the user.

Figure 10:
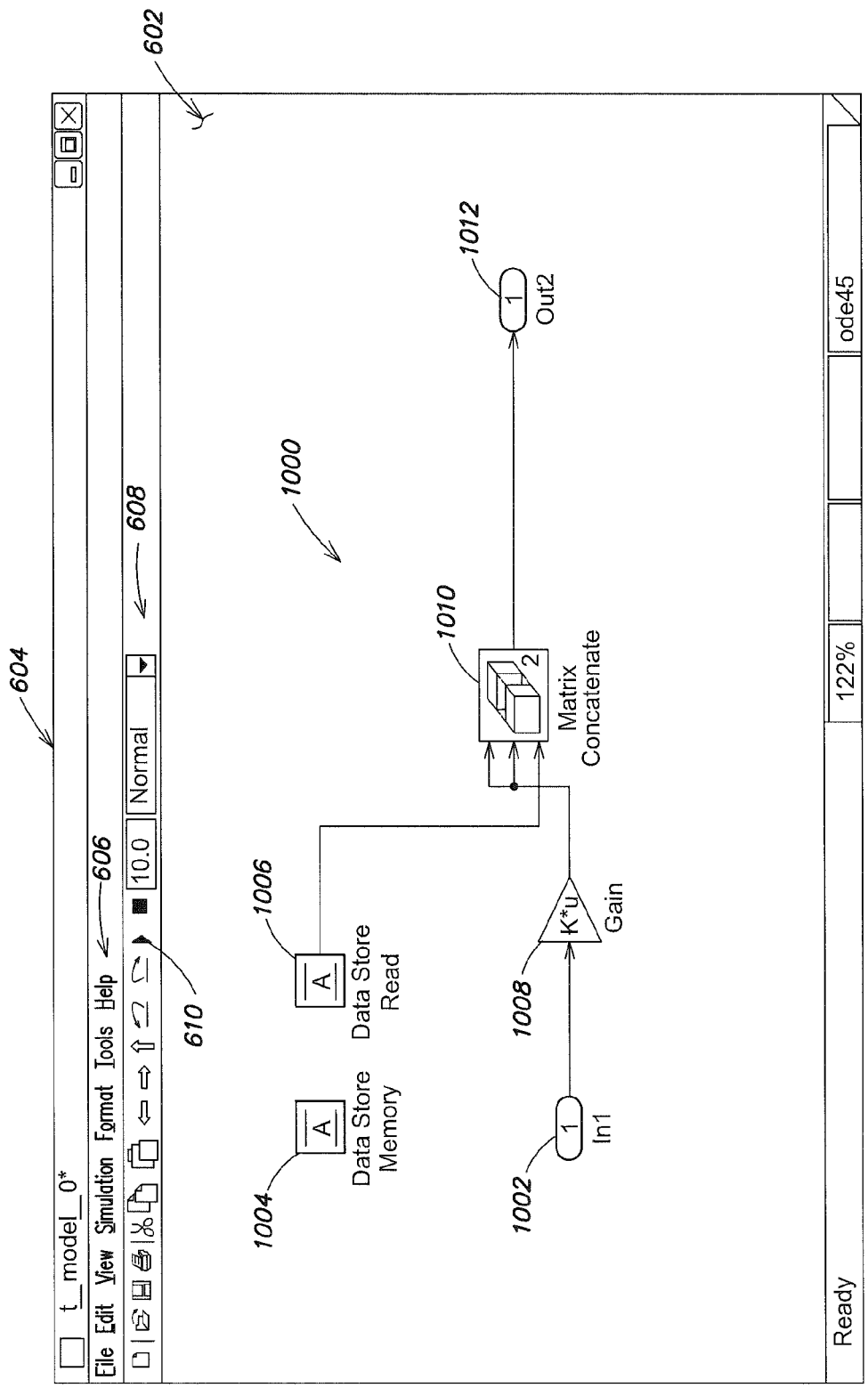
FIG. 10 is a schematic illustration of a simplified model generated from the source model of FIG. 6.

FIG. 10 is a schematic illustration of a simplified model 1000 as output by the model reduction system 110. Like the original or source model 600, the simplified model 1000 may include an Inport block 1002 (In1), a Data Store Memory block 1004, a Data Store Read block 1006, a Gain block 1008, a Matrix Concatenate block 1010, and an Outport block 1012. As shown, while the source model may be the 't_model' 600, the simplified model that is output by the model reduction system 110 may be just a portion of a subsystem several hierarchal levels down from the source model 600.

The user may analyze the simplified model 1000 to identify the source or cause of the "matrix gain dimensions mismatch" and "Port Dimensions mismatch" error messages. A matrix dimensions mismatch error may occur if the model attempts to multiply two matrices that have different sizes, such as a first matrix of size [1 1] and a second matrix of size [2 1]. An error also may occur if a model attempts to concatenate two matrices that are not the same size along the dimension of concatenation.

Optimizations

The model optimization engine 132 of the model reduction system 110 may be configured to apply one or more optimizations to the source model 134 and/or to one or more of the intermediate models 138 either before or during the model reduction process. The one or more optimizations may result in a modification to the source or intermediate model, and the condition may be evaluated on the modified model.

Figure 11:
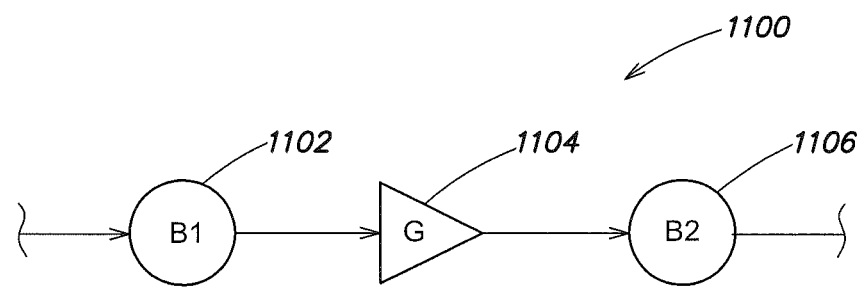
FIG. 11 is a schematic illustration of a portion of a model.

In an embodiment, the model optimization engine 132 may be configured to delete one or more selected blocks of the source model 134 and/or the intermediate models 138, and replace the deleted block with a direct connection. FIG. 11 is a schematic illustration of a portion 1100 of a model. The model portion 1100 may include a first block 1102 connected to a Gain block 1104 connected to a second block 1106. Suppose the model reduction system 110 deletes the Gain block 1104, and the condition is not satisfied, e.g., it evaluates to False, by the resulting intermediate model 138. Rather than returning the Gain block 1104, and deleting one or more other blocks or model portions, the model optimization engine 132 may create a revised model portion that omits the Gain block 1104.

Figure 12:
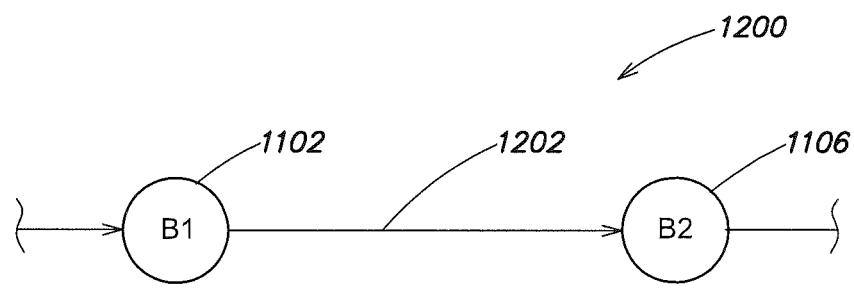
FIG. 12 is a schematic illustration of an optimized version of the model portion of FIG. 11.

FIG. 12 is a schematic illustration of a revised portion 1200 of the model that may be created by the model optimization engine 132. The revised model portion 1200 may include the first block 1102 and the second block 1106. However, the Gain block 1104 of the model portion 1100 may be replaced with a direct connection 1202 between the first and second blocks 1102, 1106. If the condition is satisfied by the intermediate model 138 that includes the model portion 1200, e.g., the condition evaluates to True, the model reduction system 110 may continue processing this intermediate model 138 that includes the model portion 1200.

In another embodiment, the model optimization engine 132 may be configured to replace one or more selected blocks of the source model 134 and/or the intermediate models 138 with one or more replacement blocks. For example, suppose an intermediate model 138 includes a model reference block that writes a signal utilized by another block of the intermediate model 138. If the condition is not satisfied when the model reference block is removed, e.g., the condition evaluates to False, the model optimization engine 132 may replace this model reference block with a non-hierarchical block that writes the signal. If the condition is then satisfied after the model reference block is replaced by the non-hierarchical block, e.g., the condition evaluates to True, then the model reduction system 110 may utilize this new intermediate model for further processing, e.g., further model reduction efforts.

Figure 13:
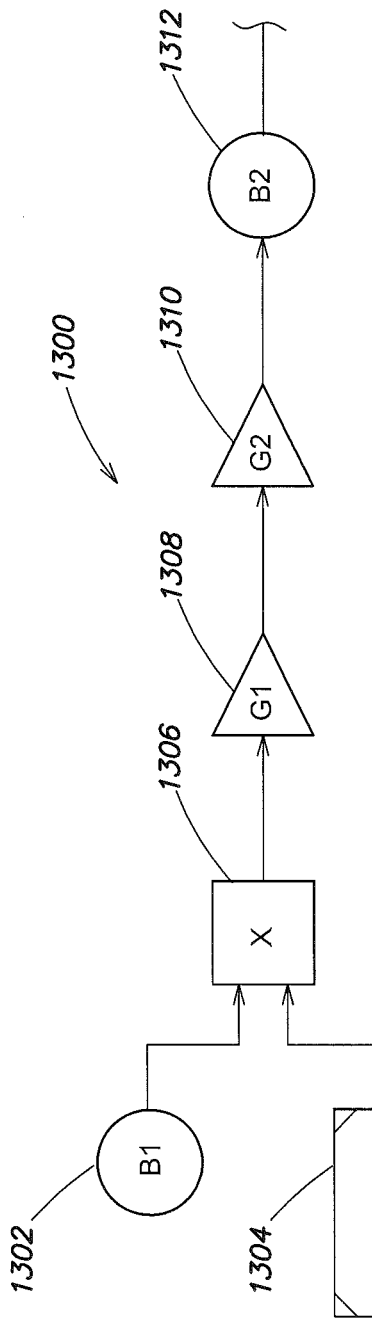
FIG. 13 is a schematic illustration of a portion of a model.

FIG. 13 is a schematic illustration of a portion 1300 of a model. The model portion 1300 may include a first block 1302 and a model reference block 1304 that are connected to a Product block 1306. The Product block 1306 may be connected to a first Gain (G1) block 1308, which is connected to a second Gain block (G2) 1310, which is connected to a second block 1312. The model reference block 1304 may reference a separate sub-model (not shown). The sub-model generates a signal that is read by the Product block 1306. The generated signal may have one or more parameters, such as data type, data dimension, etc.

Figure 14:
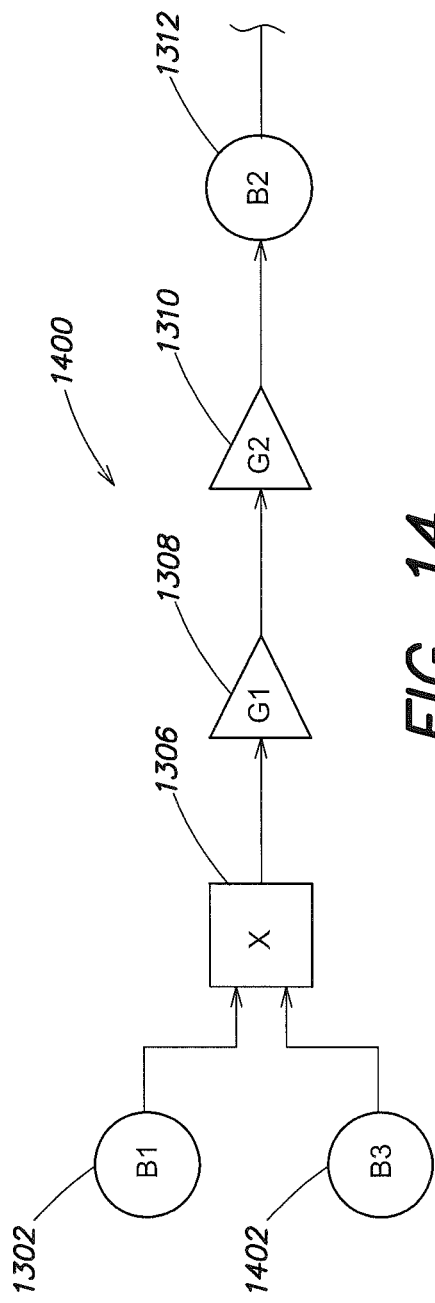
FIG. 14 is a schematic illustration of an optimized a version of the model portion of FIG. 13.

FIG. 14 is a schematic illustration of a revised model portion 1400 that may be created by the model optimization engine 132. The revised model portion 1400, like the model portion 1300, may include the first block, the Product block 1306, the first Gain block 1308, the second Gain block 1310, and the second block 1312. However, in place of the model reference block 1304, the model portion 1400 may include a third block 1402 that is not a hierarchical block. That is, the third block 1402 is not a model reference block or a subsystem. The model optimization engine 132 may configure the third block 1402 to generate a signal having the same parameters as the signal generated by the model reference block 1304.

Depending on the characteristics of the signal generated by the model reference block 1304, suitable replacement blocks include Constant blocks, Sine blocks, Cosine blocks, Signal Builder blocks, and From Workspace blocks, among others from the Simulink modeling environment.

After replacing the model reference block 1304, the model optimization engine 132 may apply the first optimization technique. For example, the model optimization engine 132 may replace the first Gain block 1308 and/or the second Gain block 1310 with a direct connection.

In another embodiment, the model optimization engine 132 may be configured to change one or more block parameters. For example, if a given block cannot be removed, because it would result in the condition no longer being satisfied, the model optimization engine 132 may modify one or more of the given block's parameters. For example, suppose a parameter of the given block has a value of [3 12 3 4343 323], the model optimization engine may change the value of this parameter to [1 1 1 1]. Following the change in value, the model reduction system 110 may determine whether the condition still occurs. If the condition is not satisfied, then the parameter may be the cause of the error or undesired behavior. If the condition is satisfied, the model reduction system 110 may attempt other model reductions, and/or the model optimization engine 132 may attempt changing other block parameter values.

In another optimization, the model optimization engine 132 may remove the hierarchy of the source model 134 by expanding all hierarchical blocks, e.g., model reference blocks and subsystem blocks, with the sub-models and subsystems represented by those hierarchical blocks. This may be referred to as model flattening.

Textual Programs

The model reduction system 110 may be utilized with computer programs specified textually and/or specified both graphically and textually.

For example, a textual program may include a plurality of functions. The model reduction system 110 may treat the functions like graphical objects. For example, the model reduction system 110 may generate a dependency order list of the functions of a source textual program. The model reduction system 110 may delete one or more portions of the source textual program, such as one or more functions, and determine whether the resulting intermediate textual program satisfies a specified condition. If so, the model reduction system 110 may continue to remove one or more portions generating new intermediate textual programs, until the removal of any remaining portions results in an intermediate textual program that does not satisfy the condition. This last intermediate textual program may be designated as a simplified textual program, and may be output to a user. For example, a source listing of the simplified textual program may be displayed to the user.

Illustrative Data Processing System

Figure 15:
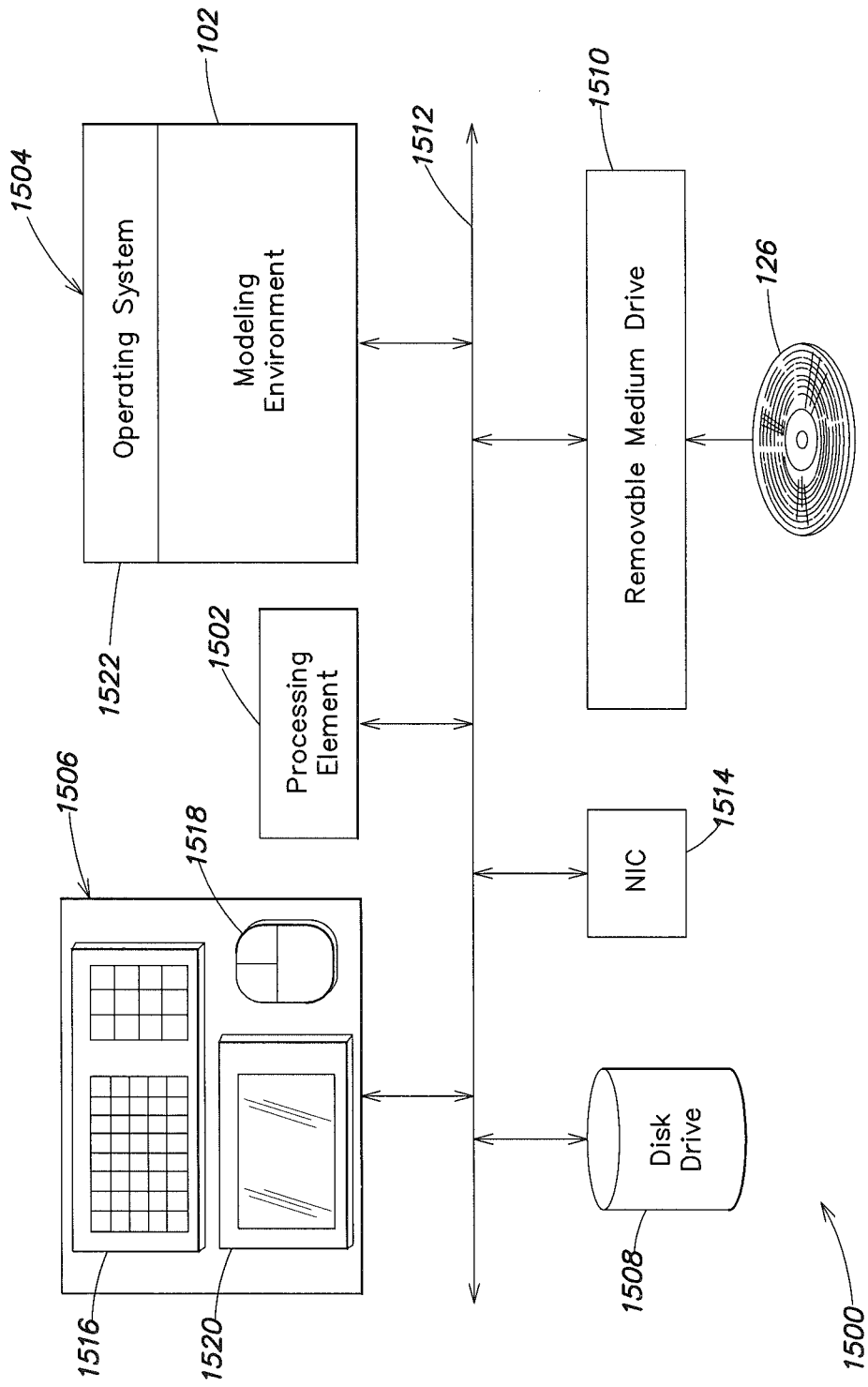
FIG. 15 a schematic illustration of a computer or data processing system in accordance with an embodiment of the invention.

FIG. 15 is a schematic illustration of a computer or data processing system 1500 for implementing an embodiment of the invention. The computer system 1500 may include one or more processing elements, such as a processing element 1502, a main memory 1504, user input/output (I/O) 1506, a persistent data storage unit, such as a disk drive 1508, and a removable medium drive 1510 that are interconnected by a system bus 1512. The computer system 1500 may also include a communication unit, such as a network interface card (NIC) 1514. The user I/O 1506 may include a keyboard 1516, a pointing device, such as a mouse 1518, and a display 1520. Other user I/O 1506 components include voice or speech command systems, other pointing devices include touchpads and touchscreens, and other output devices besides a display, include a printer, a projector, a touchscreen, etc. Exemplary processing elements include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 1504, which may be a Random Access Memory (RAM), may store a plurality of program libraries or modules, such as an operating system 1522, and one or more application programs that interface to the operating system 1522, such as the modeling environment 102.

The removable medium drive 1510 may accept and read a computer readable medium 1526, such as a CD, DVD, floppy disk, solid state drive, tape, flash memory or other non-transitory medium. The removable medium drive 1510 may also write to the computer readable medium 1526.

Suitable computer systems include personal computers (PCs), workstations, servers, laptops, tablets, palm computers, smart phones, electronic readers, and other portable computing devices, etc. Nonetheless, those skilled in the art will understand that the computer system 1500 of FIG. 15 is intended for illustrative purposes only, and that the present invention may be used with other computer systems, data processing systems, or computational devices. The present invention may also be used in a networked, e.g., client-server, computer architecture, or a public and/or private cloud computing arrangement. For example, the modeling environment application 102 may be hosted on a server, and accessed by a remote client through an application hosting system, such as the Remote Desktop Connection tool from Microsoft Corp.

Suitable operating systems 1522 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 1522 may provide services or functions for other modules, such as allocating memory, organizing data according to a file system, prioritizing requests, etc. The operating system 1522 may run on a virtual machine, which may be provided by the data processing system 1500.

As indicated above, a user or developer, such as an engineer, scientist, programmer, etc., may utilize one or more input devices, such as the keyboard 1516, the mouse 1518, and the display 1520 to operate the modeling environment 102, and construct one or more models of a system that is being designed or evaluated. The models may be computational and may have executable semantics. In particular, the models may be executable. In particular, the model may provide one or more of time-based, event-based, state-based, frequency-based, control-flow based, and dataflow-based execution semantics. The execution of a model may simulate operation of the system that is being designed or evaluated.

A model reduction process in accordance with an embodiment may be performed on a data processing system that supports parallel execution of tasks so that parts of the process may be performed in parallel. Exemplary parts of the process that may be performed in parallel may include the application of one or more search algorithms to identify portions of the source or an intermediate model as candidates for removal, and the evaluation of the condition using the revised or modified model, among others. For example, an embodiment of the model reduction process may be implemented on one or more data processing systems having a plurality of workers. Each worker may be tasked or configured to identify different portions of the model for removal, and to evaluate the condition using the revised model. For instance, a first worker may create a plurality of intermediate models for evaluation by removing various portions of a source model, and a plurality of other workers may evaluate the condition as applied to the plurality of intermediate models. In another embodiment, a first plurality of workers may be tasked with creating different intermediate models by removing different model portions, such as different bundles identified by the binary search algorithm, and a second plurality of workers may be tasked with evaluating the condition against these different intermediate models. The results produced by the workers, such as whether the condition was satisfied or not, e.g., whether it evaluated to True or False, and the structure of the revised model, may be returned by the workers to an entity that manages the workers. Based on the results received from the workers, the entity may issue new tasks to be performed by the workers, such as further processing of one or more of the revised models returned by the workers in a prior step.

The foregoing description of embodiments is intended to provide illustration and description, but is not intended to be exhaustive or to limit the invention to the precise form disclosed. Modifications and variations are possible in light of the above teachings or may be acquired from a practice of the invention. For example, while a series of acts has been described above with respect to the flow diagrams, the order of the acts may be modified in other implementations. Further, non-dependent acts may be performed in parallel. Also, the term "user", as used herein, is intended to be broadly interpreted to include, for example, a computer or data processing system (e.g., system 1500) or a user of a computer or data processing system, unless otherwise stated.

Further, certain embodiments of the invention may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 1500. The computer-executable instructions may include instructions that implement one or more embodiments of the invention. The tangible non-transitory computer-readable storage media may be volatile or non-volatile and may include, for example, flash memories, dynamic memories, removable disks, and non-removable disks.

No element, act, or instruction used herein should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present invention. It will be apparent, however, that other variations and modifications may be made to the described embodiments, with the attainment of some or all of their advantages. Therefore, it is the object of the appended claims to cover all such variations and modifications as come within the true spirit and scope of the invention.

What is claimed is:

1. A method comprising:
    receiving a source model, the source model having executable semantics and including a plurality of graphical objects;
    receiving a condition for the source model, where the condition evaluates to a first value or to a second value when execution of the source model is started;
    applying, by processing logic, one or more search algorithms to the source model to identify portions of the source model as candidates for removal; and
    generating automatically, by the processing logic, a simplified model from the source model by:
        removing from the source model at least one first portion, provided that the received condition, when evaluated using the source model following the removal of the at least one first portion, evaluates to the first value, the at least one first portion including a first set of the plurality of graphical objects; and
        retaining in the source model at least one second portion, provided that the received condition, when evaluated using the source model following the removal of the at least one second portion, evaluates to the second value, the at least one second portion including a second set of the plurality of graphical objects, where
        the simplified model has a size that is smaller than a size of the source model, and
        evaluation of the received condition for the simplified model returns the first value.

2. The method of claim 1 wherein the size of the source and simplified models is selected from the group consisting of:
    a total number of blocks;
    a total number of block parameters; and
    a total number of lines.

3. The method of claim 1 wherein
    the first value indicates that the condition is satisfied, and
    the second value indicates that the condition is not satisfied.

4. The method of claim 1 wherein the one or more search algorithms are selected from the group consisting of:
    a random search algorithm;
    a binary search algorithm;
    a ternary search algorithm; and
    a linear search algorithm.

5. The method of claim 1 wherein the one or more search algorithms includes a binary search algorithm and a linear search algorithm.

6. The method of claim 1 wherein the applying includes applying a binary search algorithm to the source model to generate a binary intermediate model, where
    the binary intermediate model has a size that is smaller than the size of the source model,
    the executable condition for the binary intermediate model returns true, and
    reducing the binary intermediate model further, using the binary search algorithm, causes the executable condition to return false.

7. The method of claim 6 wherein the applying includes applying a linear search algorithm to the binary intermediate model to generate the simplified model, where
    the size of the simplified model is smaller than the size of the binary intermediate model, and
    reducing the simplified model further, using the linear search algorithm, causes the condition, when evaluated, to return the second value.

8. The method of claim 1 wherein the condition is selected from the group consisting of:
    an error condition that occurs during execution of the source model;
    an error condition that occurs during compilation of the source model;
    an undesired behavior that occurs during execution of the source model; and
    an undesired behavior that occurs during compilation of the source model.

9. The method of claim 1 wherein
    the source model has a plurality of hierarchical levels, and
    the one or more search algorithms is applied to the plurality of hierarchical levels.

10. The method of claim 1 further comprising:
    identifying portions of the source model as candidates for removal, wherein
    the portions identified as candidates for removal are identified by a first worker,
    a plurality of second workers evaluate the received condition following removal of respective ones of the identified portions, and
    the plurality of second workers operate in parallel with respect to each other.

11. The method of claim 1 further comprising:
    identifying portions of the source model as candidates for removal, wherein
    the portions identified as candidates for removal are identified in parallel by a first plurality of workers, and
    a second plurality of workers evaluate the received condition following removal of respective ones of the identified portions,
    the first plurality of workers operate in parallel with respect to each other, and
    the second plurality of workers operate in parallel with respect to each other.

12. The method of claim 6 wherein the size of the binary intermediate model and the size of the source model are based on at least one of:
    a total number of blocks;
    a total number of block parameters; and
    a total number of lines.

13. A non-transitory, computer-readable storage medium with an executable program stored thereon, where the program instructs a processor to:

receive a criterion that, when evaluated by processing logic, returns either a first value or a second value, and where the criterion is associated with
a source model having executable semantics and including a plurality of graphical objects;
identify a portion of the source model as a candidate for removal;
determine whether the criterion evaluates to the first or the second value following the removal of the identified portion, the identified portion including a first set of the plurality of graphical objects;
remove the identified portion from the source model, if the criterion evaluated to the first value;
return the identified portion to the source model, if the criterion evaluated to the second value; and
generate a simplified model having a size that is smaller than a size of the source model by repeating the identify, determine, remove, and return steps one or more times for other portions, where
the criterion evaluates to the first value when evaluated using the simplified model.

14. The non-transitory computer readable medium of claim 13 wherein
the identify includes apply a search algorithm to the source model.

15. The non-transitory computer readable medium of claim 14 where the search algorithm includes one or more of:
a random search algorithm;
a binary search algorithm;
a ternary search algorithm; and
a linear search algorithm.

16. The non-transitory computer readable medium of claim 13 wherein the source model is an executable block diagram.

17. The non-transitory computer readable medium of claim 13 wherein the size of the simplified model and the size of the source model are based on at least one of:
a total number of blocks;
a total number of block parameters; and
a total number of lines.

18. An apparatus comprising:
an output device; and
a processor coupled to the output device, wherein the processor is programmed to
receive a source model, the source model having executable semantics and including a plurality of graphical objects;
receive a criterion for the source model, the criterion evaluates to a first value or to a second value when execution of the source model is begun;
identify a portion of the source model as a candidate for removal, the portion of the source model includes some of the plurality of graphical objects;
temporarily remove the identified portion from the source model;
determine whether the criterion evaluates to the first or the second value following the temporary removal of the identified portion;
permanently remove the identified portion from the source model, if the criterion evaluated to the first value;
return the identified portion to the source model, if the criterion evaluated to the second value;
generate a simplified model having a size that is smaller than a size of the source model by repeating the identify, temporarily remove, determine, permanently remove, and return steps one or more times for other portions; and
present the simplified model on the output device.

19. The apparatus of claim 18 wherein the model is specified:
graphically, or
a combination of graphically and textually.

20. The apparatus of claim 18 wherein the processor is further programmed to apply one or more search algorithms to the source model to identify the portion of the source model as a candidate for removal.

21. The apparatus of claim 20 wherein the one or more search algorithms are selected from the group consisting of:
a random search algorithm;
a binary search algorithm;
a ternary search algorithm; and
a linear search algorithm.

22. The apparatus of claim 18 wherein the processor is further programmed to apply one or more optimizations to the model.

23. The apparatus of claim 22 wherein the one or more optimizations are selected from the group consisting of:
replacing a hierarchical block with a non-hierarchical block;
replacing at least one block with a direct connection; and
modifying a parameter of one or more blocks.

24. The apparatus of claim 18 wherein the size of the simplified model and the size of the source model are based on at least one of:
a total number of blocks;
a total number of block parameters; and
a total number of lines.

* * * * *